US007007215B2

(12) United States Patent
Kinoshita et al.

(10) Patent No.: US 7,007,215 B2

(45) Date of Patent: Feb. 28, 2006

(54) TEST CIRCUIT CAPABLE OF TESTING EMBEDDED MEMORY WITH RELIABILITY

(75) Inventors: Mitsuya Kinoshita, Hyogo (JP); Tetsushi Tanizaki, Hyogo (JP); Masaru Haraguchi, Hyogo (JP); Katsumi Dosaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 507 days.

(21) Appl. No.: 10/173,266

(22) Filed: Jun. 18, 2002

(65) Prior Publication Data

US 2003/0018939 A1 Jan. 23, 2003

(30) Foreign Application Priority Data

Jul. 19, 2001 (JP) ............................ 2001-219578
Sep. 26, 2001 (JP) ............................ 2001-294240

(51) Int. Cl.
*G01R 31/30* (2006.01)

(52) U.S. Cl. ...................... 714/745; 714/799; 714/718; 714/724

(58) Field of Classification Search ................ 714/726, 714/718, 724, 727, 719

See application file for complete search history.

(56) References Cited

U.S. PATENT DOCUMENTS

| | | | | |
|---|---|---|---|---|
| 5,497,378 | A * | 3/1996 | Amini et al. | 714/727 |
| 5,642,362 | A * | 6/1997 | Savir | 714/726 |
| 6,298,465 | B1 * | 10/2001 | Klotchkov | 714/814 |
| 6,467,043 | B1 * | 10/2002 | LaBerge | 713/401 |
| 6,490,702 | B1 * | 12/2002 | Song et al. | 714/726 |
| 6,587,804 | B1 * | 7/2003 | Johnson et al. | 702/107 |
| 6,636,980 | B1 * | 10/2003 | Gervais et al. | 713/600 |
| 6,680,871 | B1 * | 1/2004 | Price | 365/201 |
| 6,691,272 | B1 * | 2/2004 | Azim | 714/744 |

FOREIGN PATENT DOCUMENTS

JP 2000-164000 6/2000

OTHER PUBLICATIONS

"An Embedded DRAM Hybrid Macro with Auto Signal Management and Enhanced-on-Chip Tester", N. Watanabe et al., 2001 IEEE ISSCC Digest of Technical Papers, Feb. 7, 2001, pp. 388-389.

* cited by examiner

*Primary Examiner*—Albert Decady
*Assistant Examiner*—John P. Trimmings
(74) *Attorney, Agent, or Firm*—McDermott Will & Emery LLP

(57) ABSTRACT

A test signal applied to an embedded memory is changed in synchronization with a test clock signal, set to an invalidated state by an asynchronous control signal asynchronous to the test clock signal and then is applied to a memory. The memory takes in a received signal in synchronization with a memory clock signal. An invalid data generating circuit modifies the test signal in accordance with the asynchronous control signal and generates a test signal and to apply the test signal to the memory. A period of an invalid state of the modified test signal can be adjusted and therefore, by monitoring a changing timing of the asynchronous control signal PTX with an external tester, setup and hold times of a signal for the memory can be measured. Setup and hold times and an access time for an embedded memory can be correctly measured.

12 Claims, 25 Drawing Sheets

F I G. 1
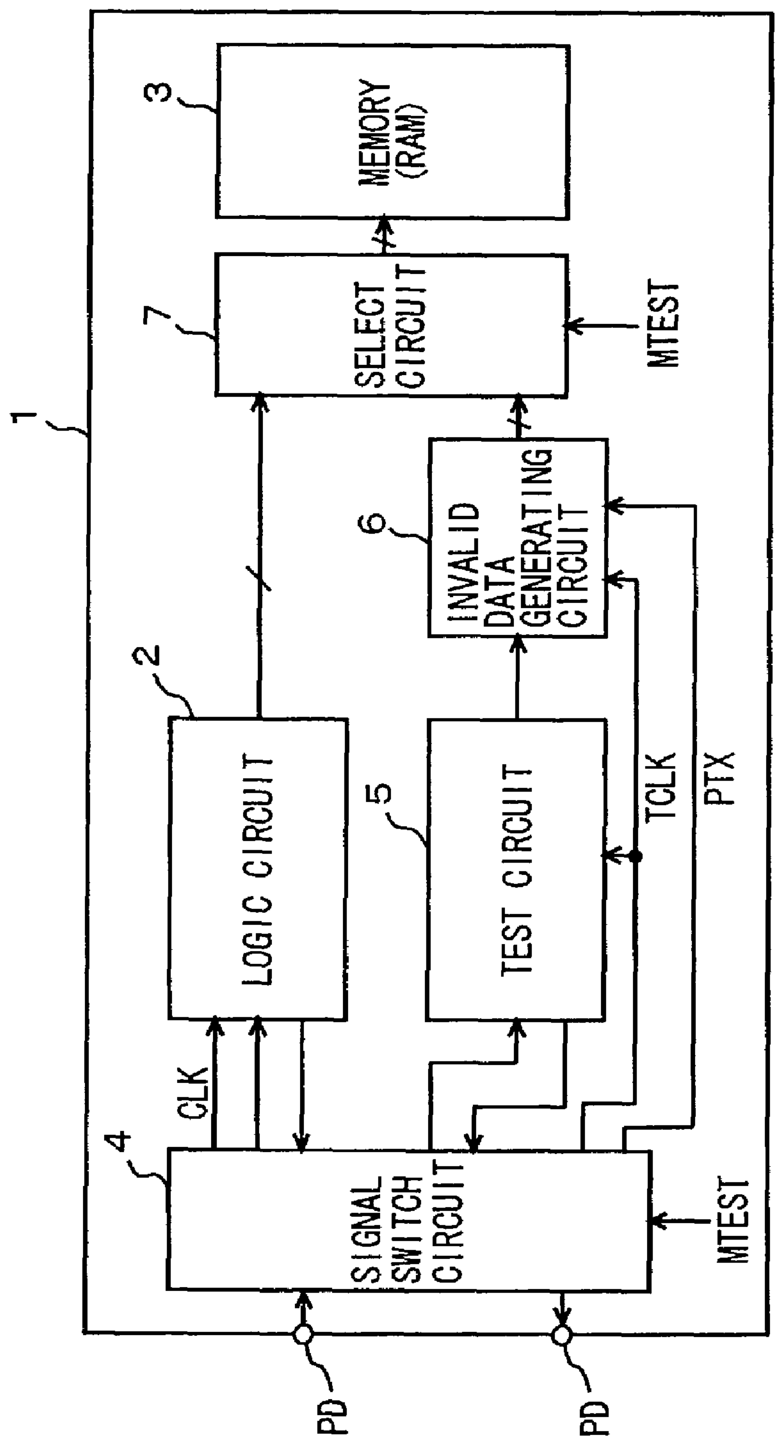

F I G. 2
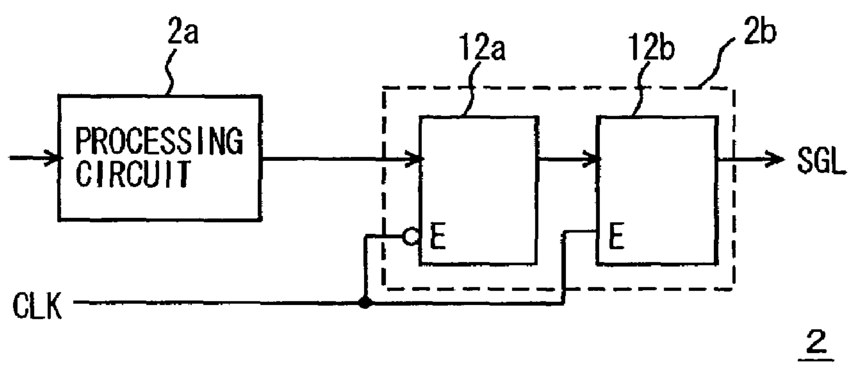
F I G. 3
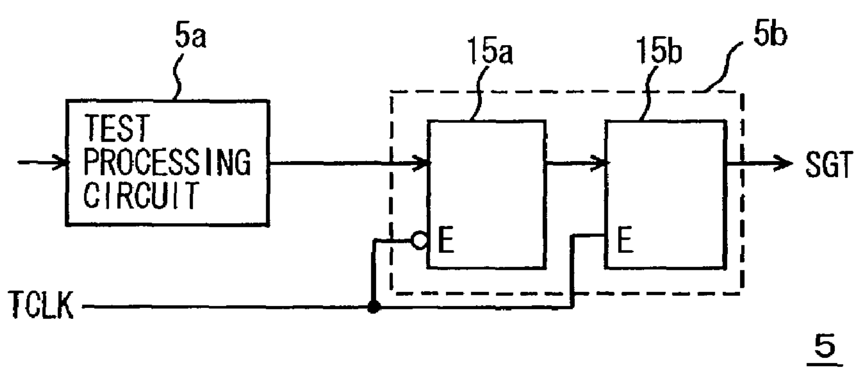

F I G. 4
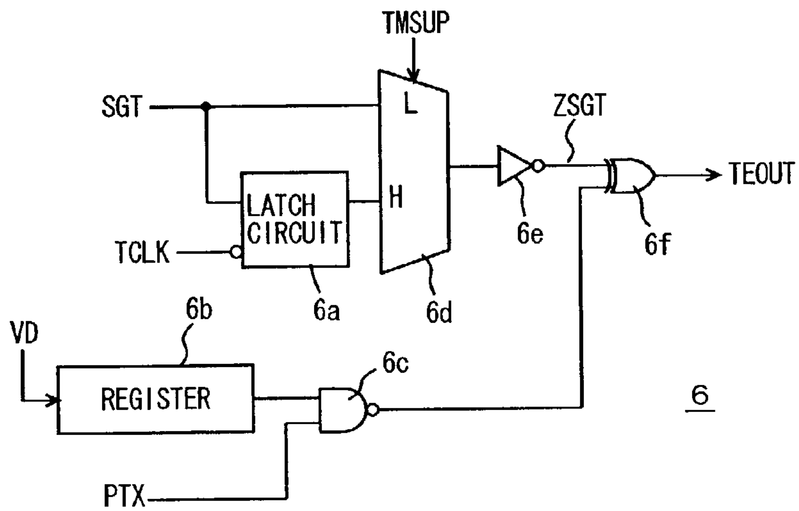
F I G. 5
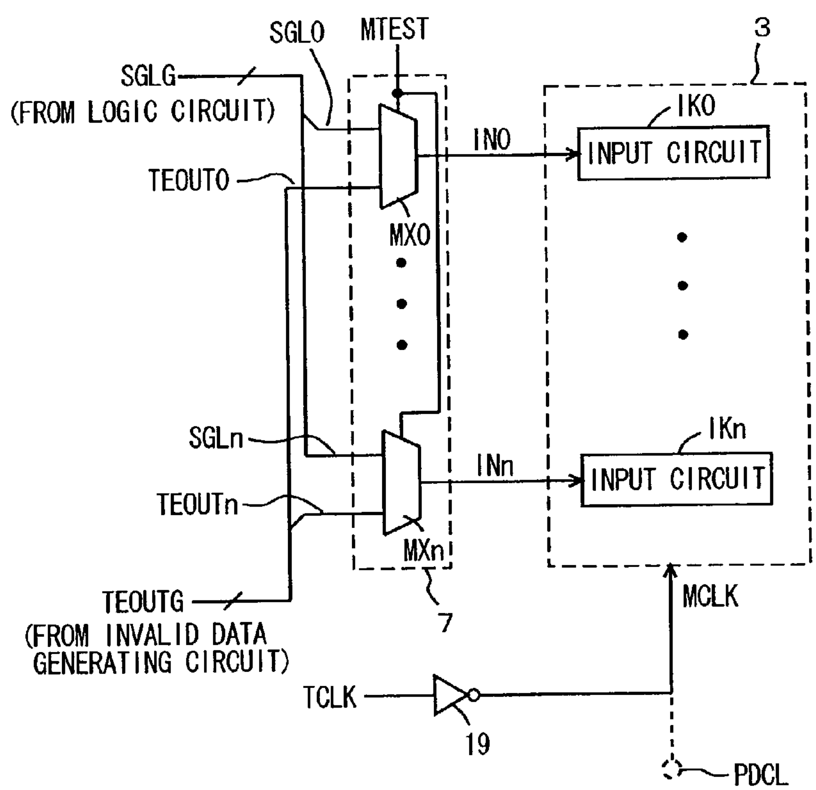

F I G. 6
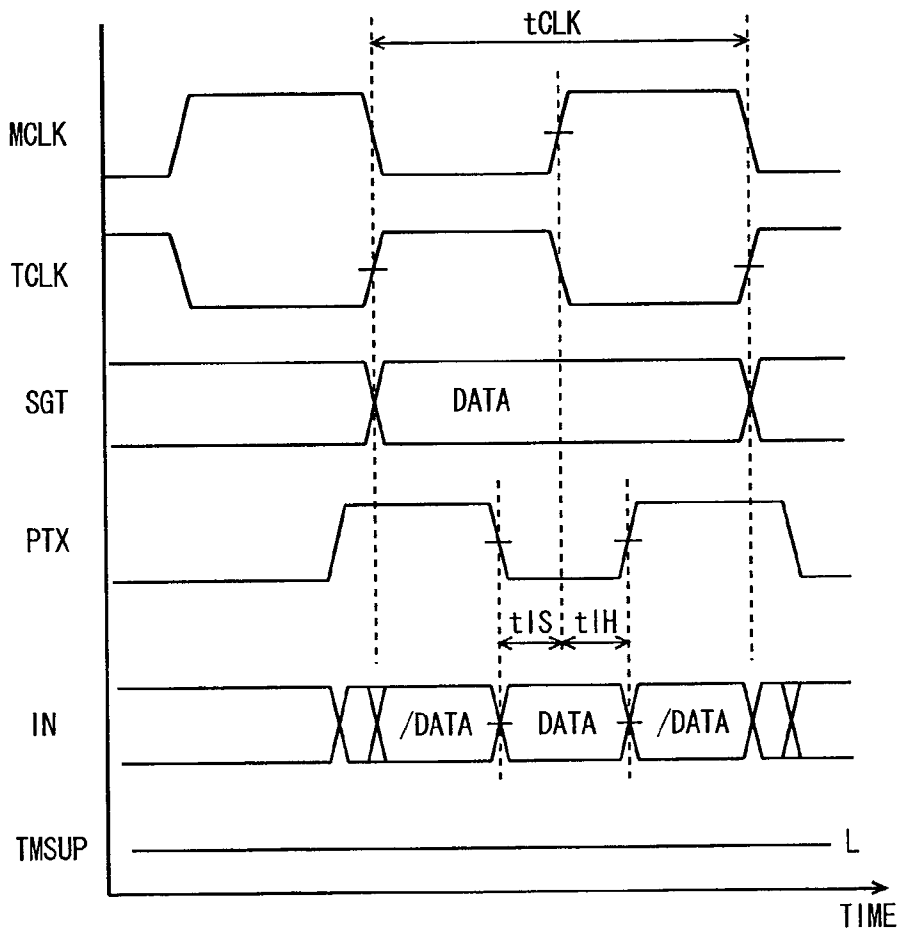
F I G. 7
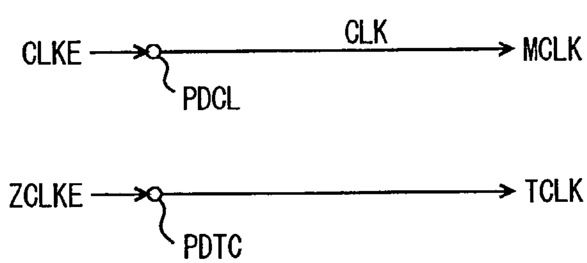
F I G. 8
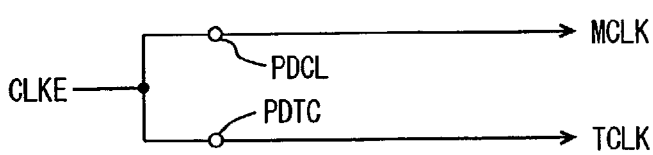

F I G. 1 1
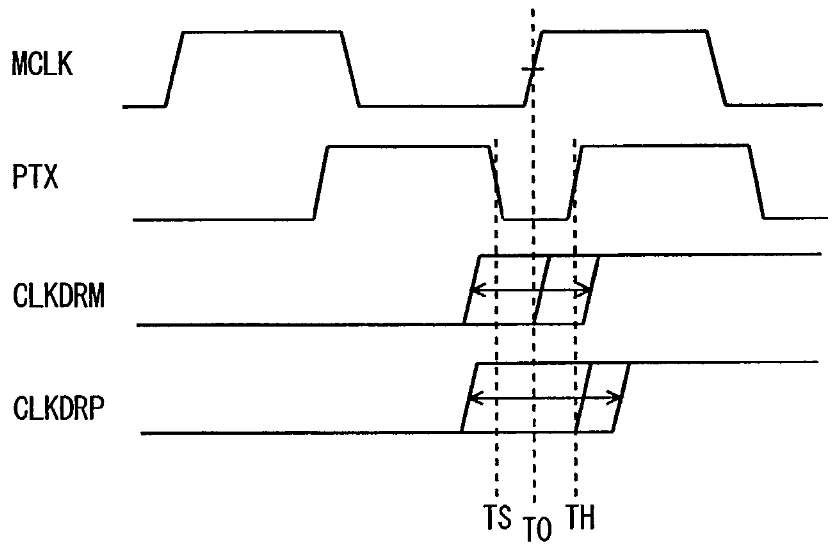
F I G. 1 2
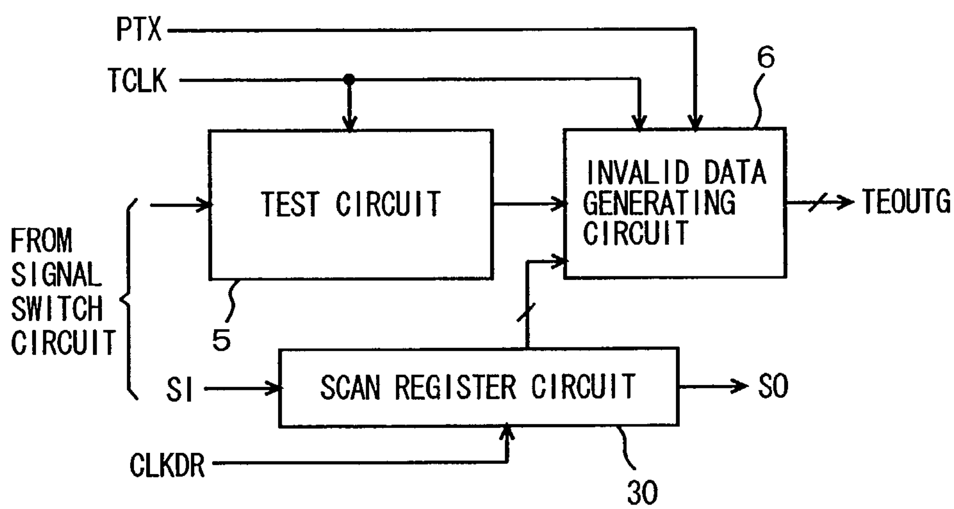

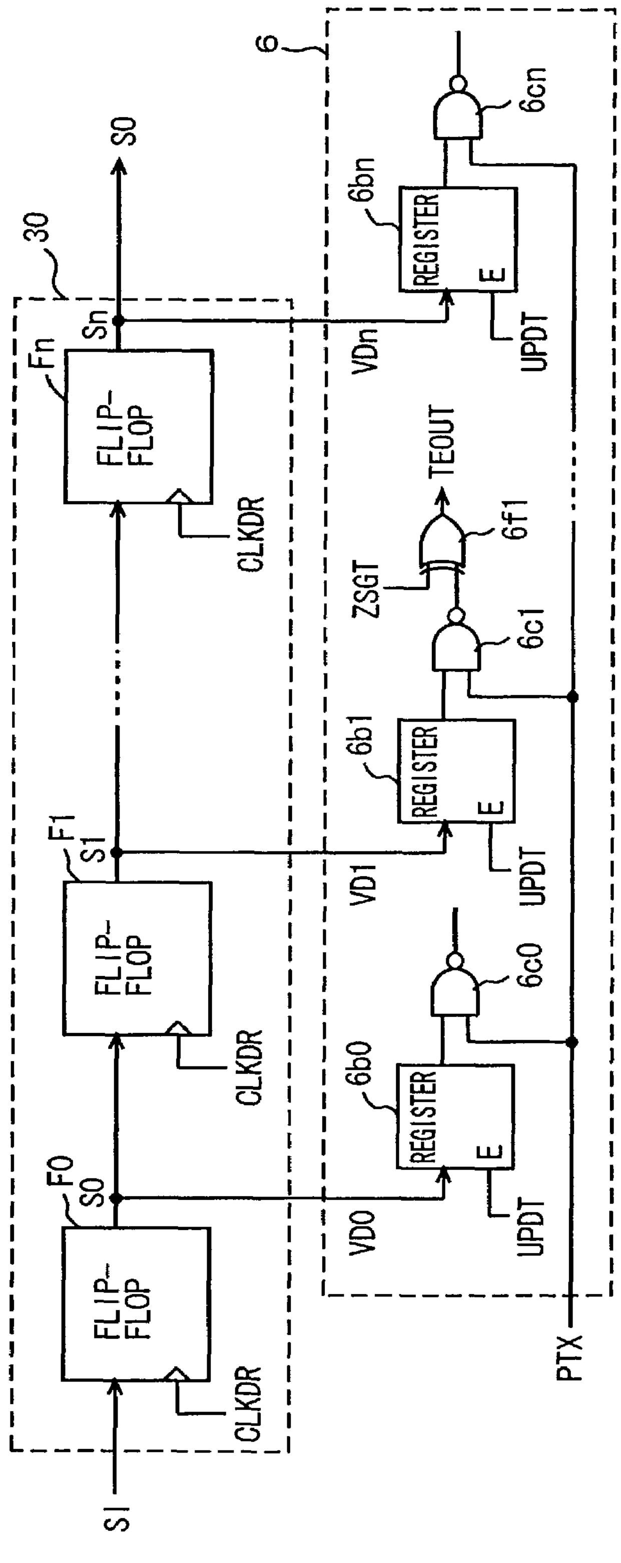
F I G. 1 3

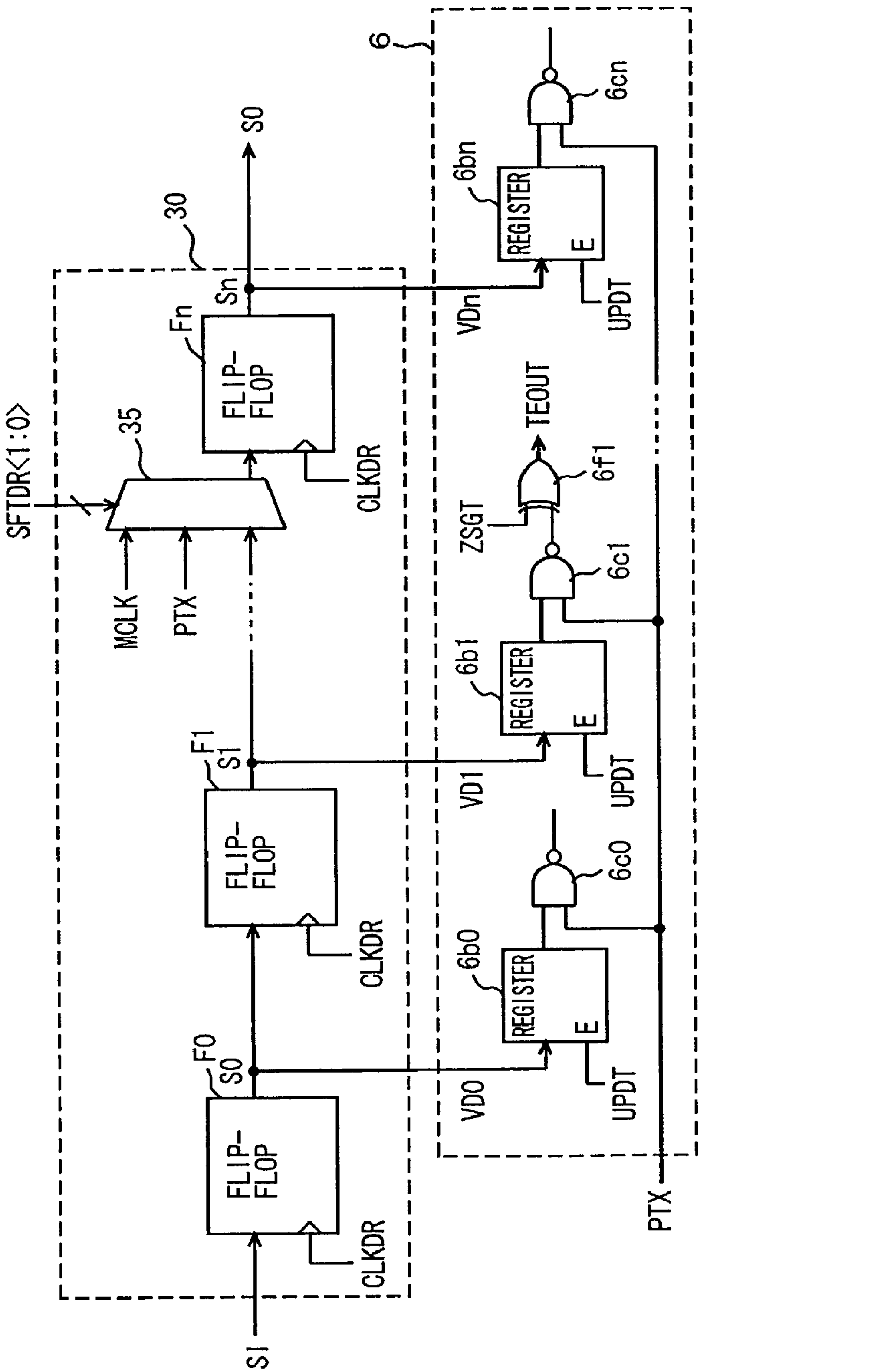
F I G. 1 4

F I G. 1 5
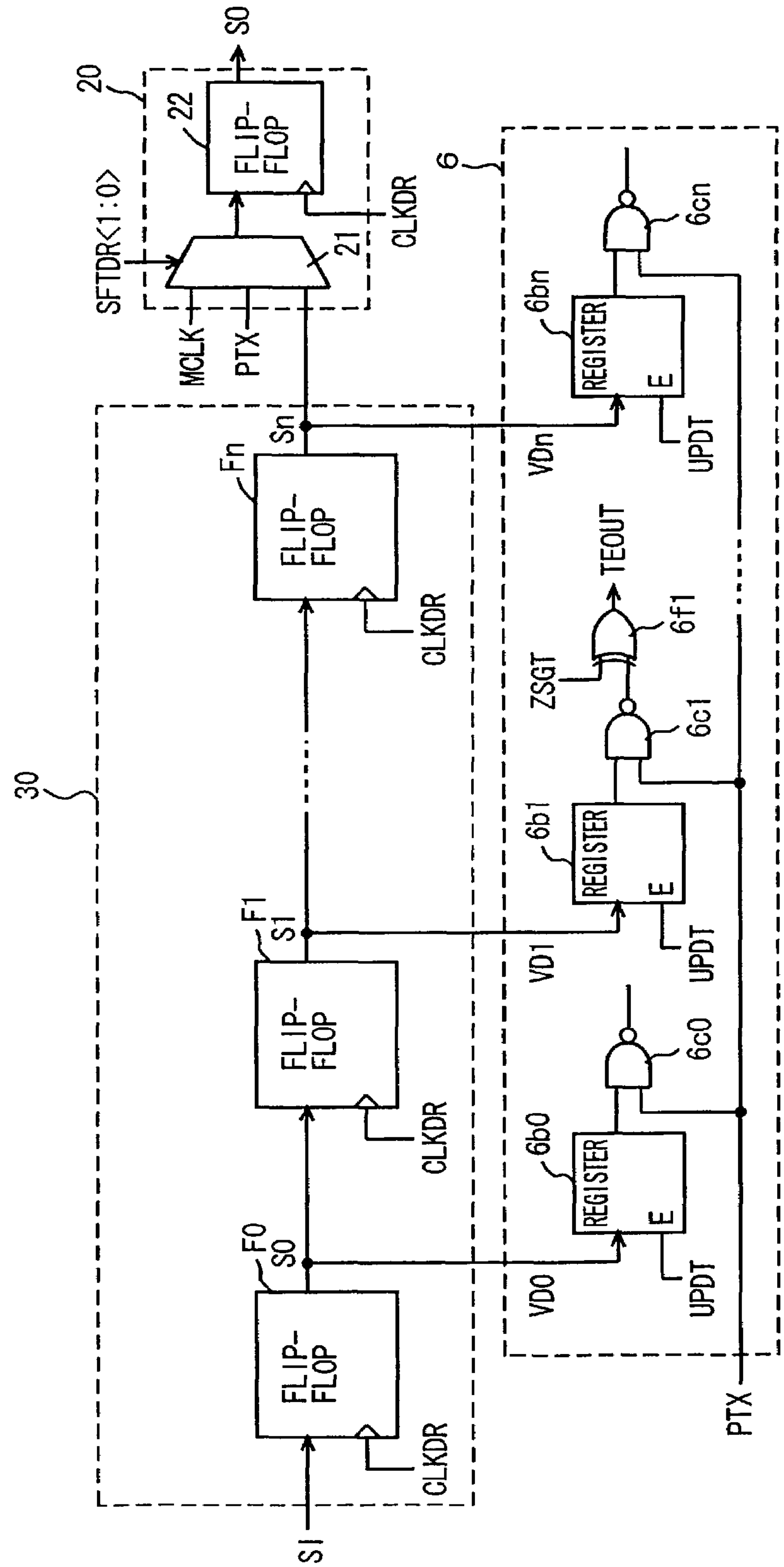

F I G. 1 6
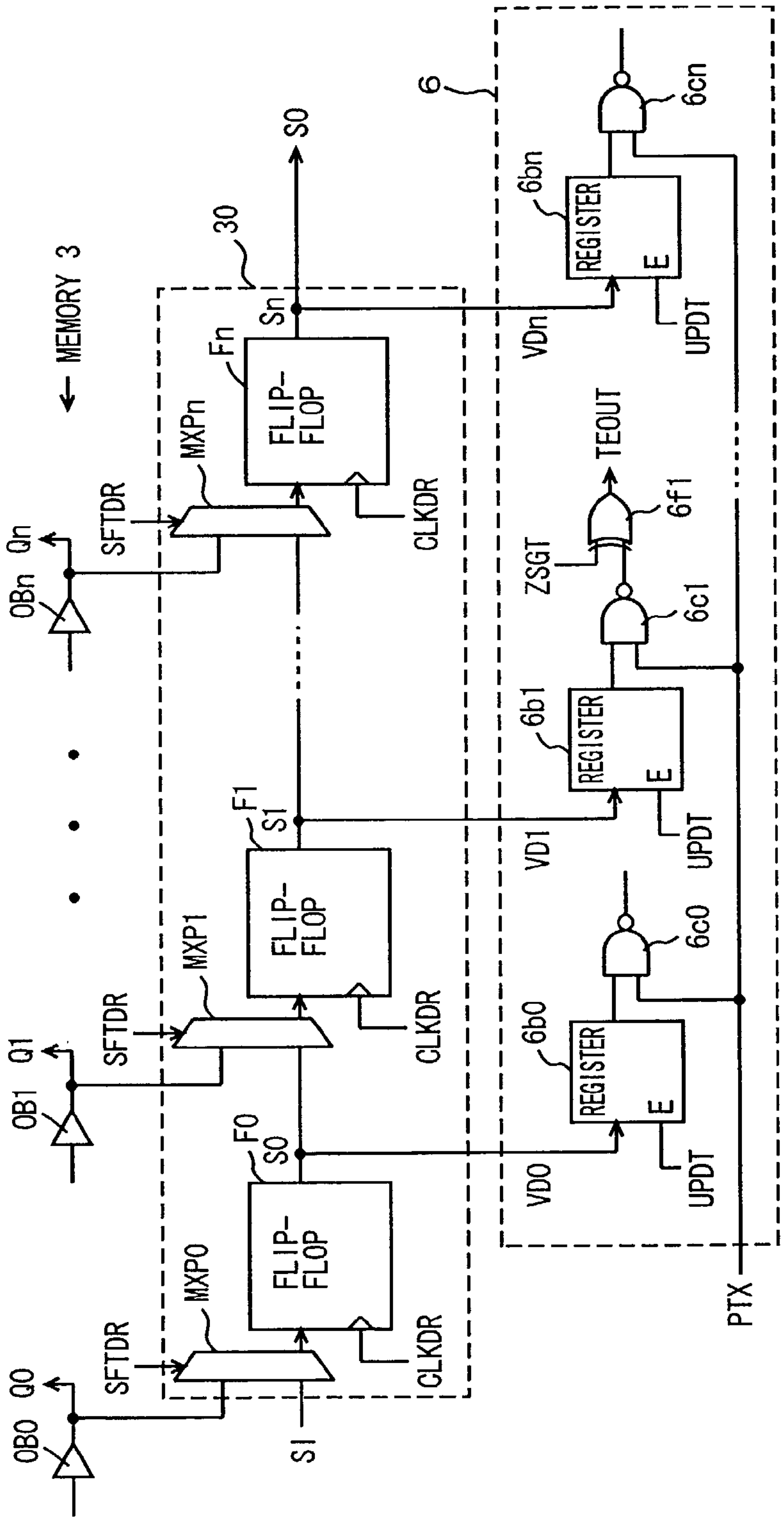

F I G. 1 7
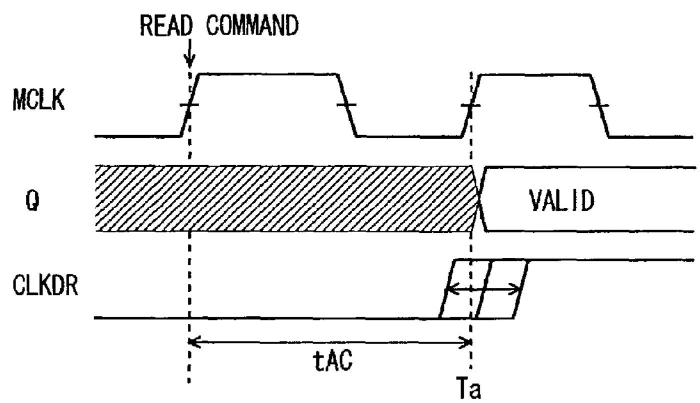
F I G. 1 8
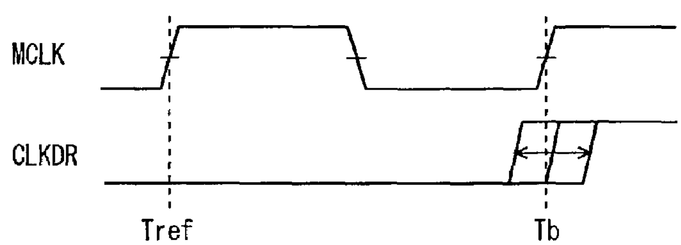
F I G. 1 9
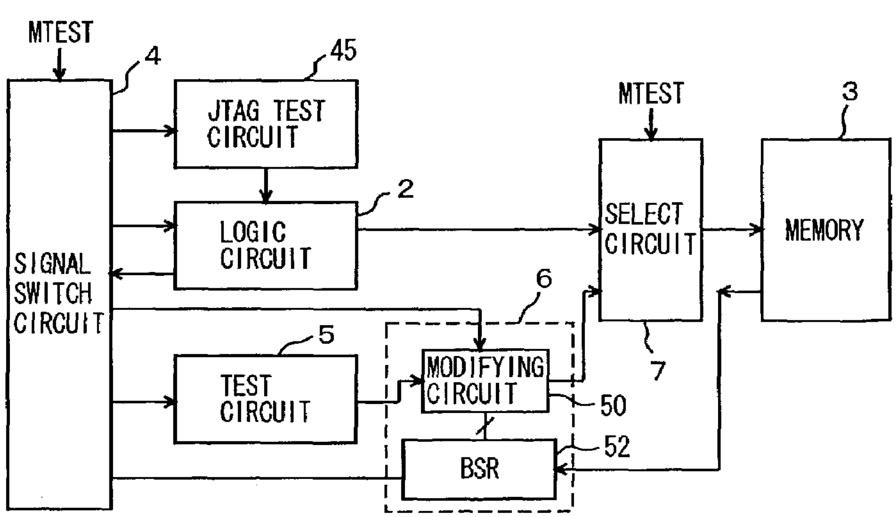

F I G. 2 2
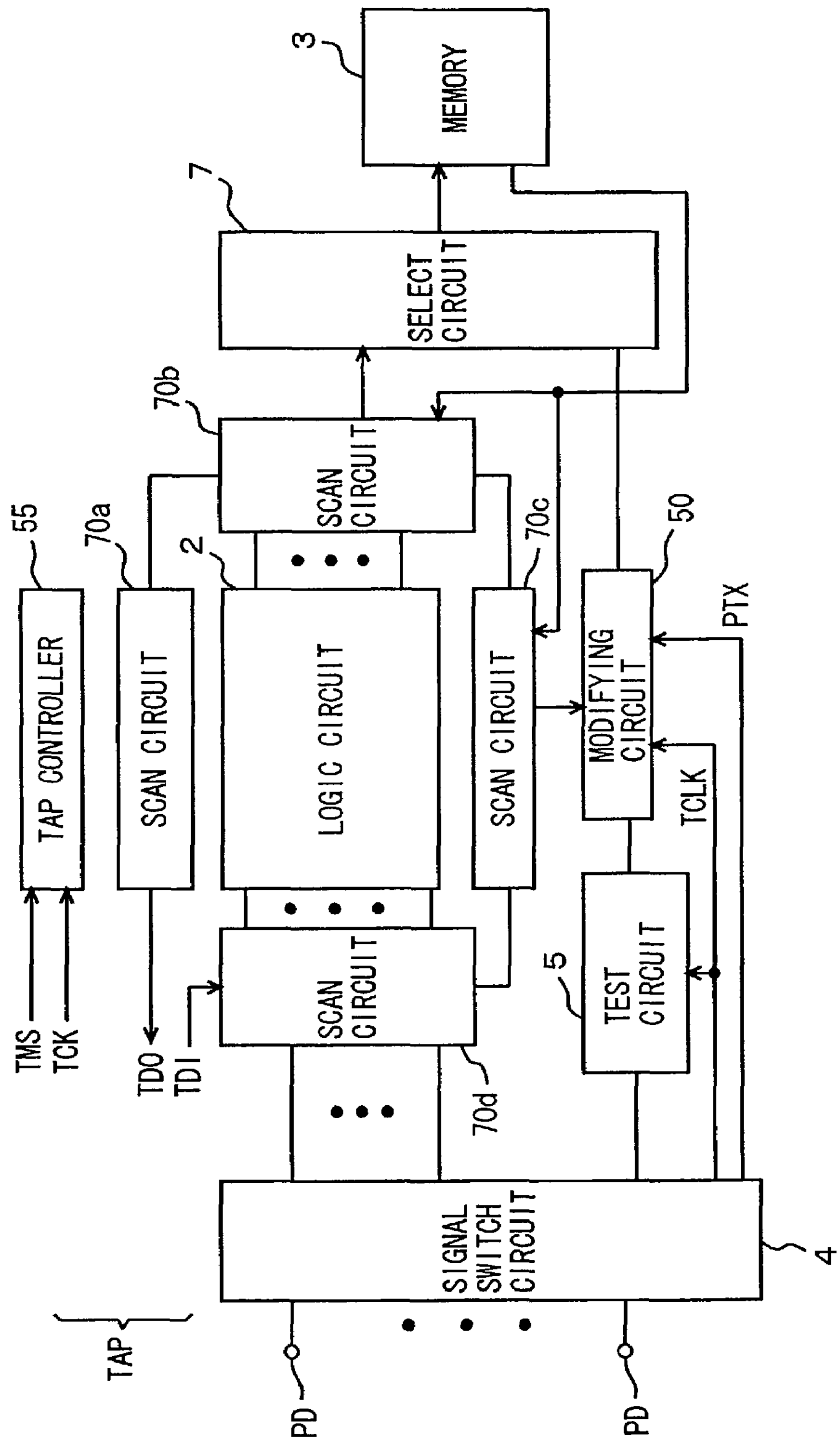

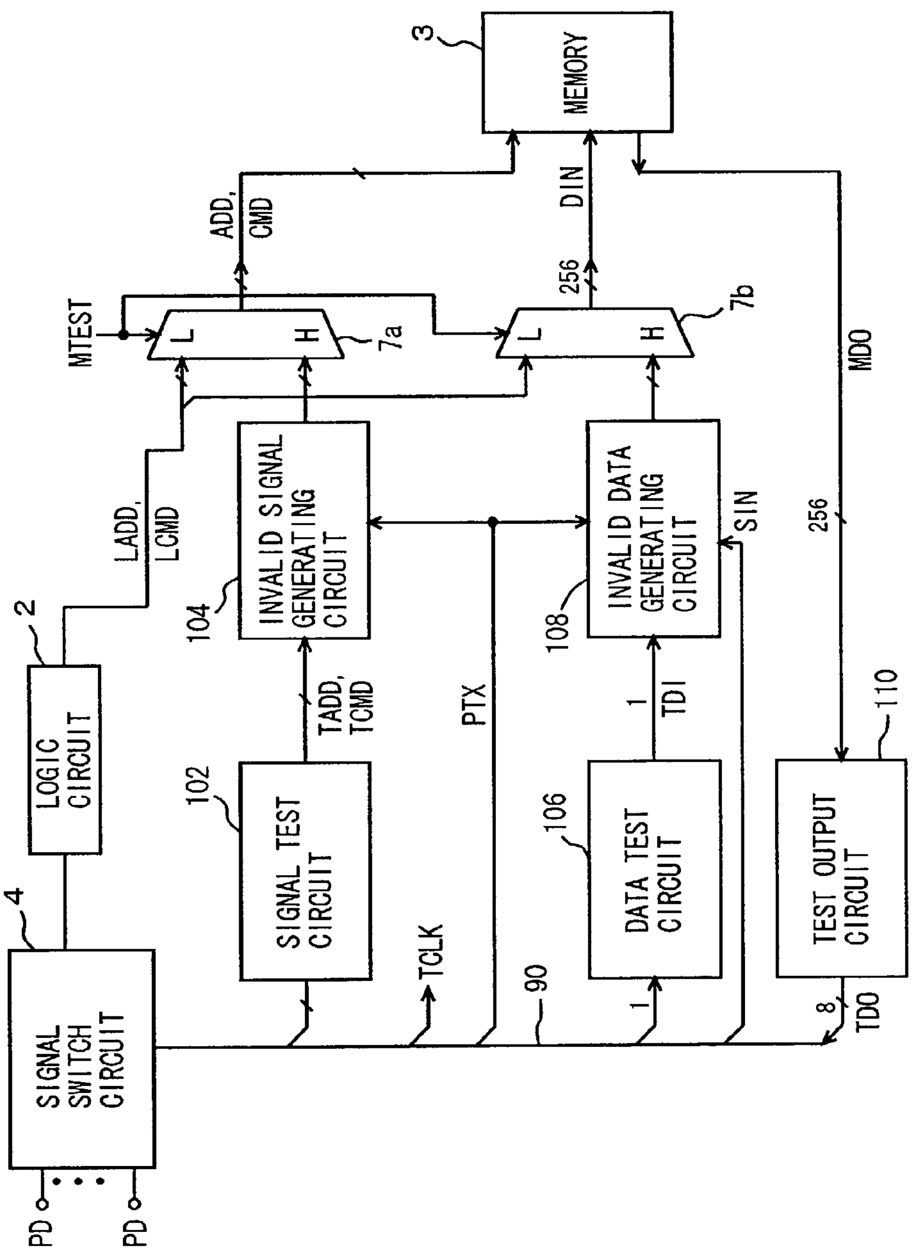
F I G. 2 4

F I G. 3 0
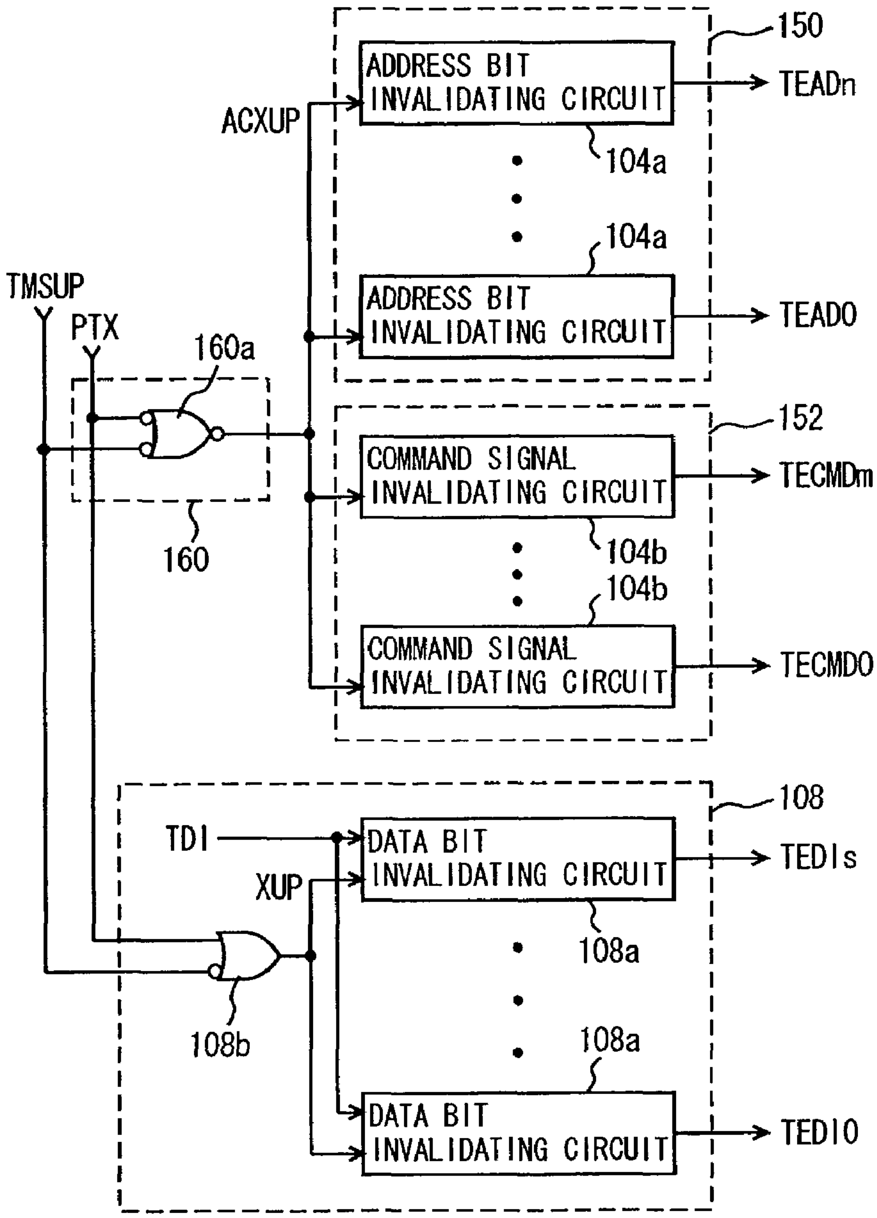

F I G. 3 3
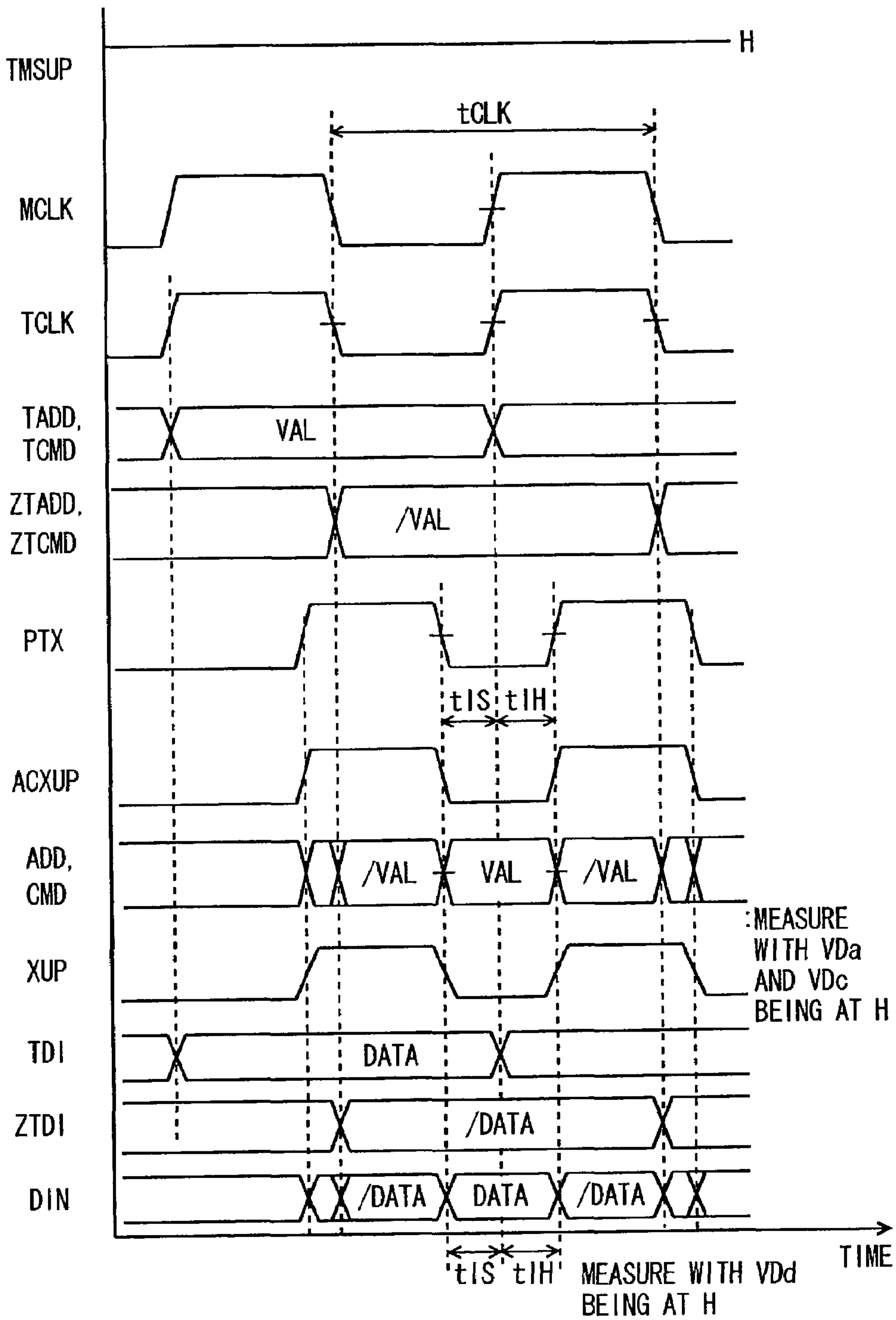

F I G. 34
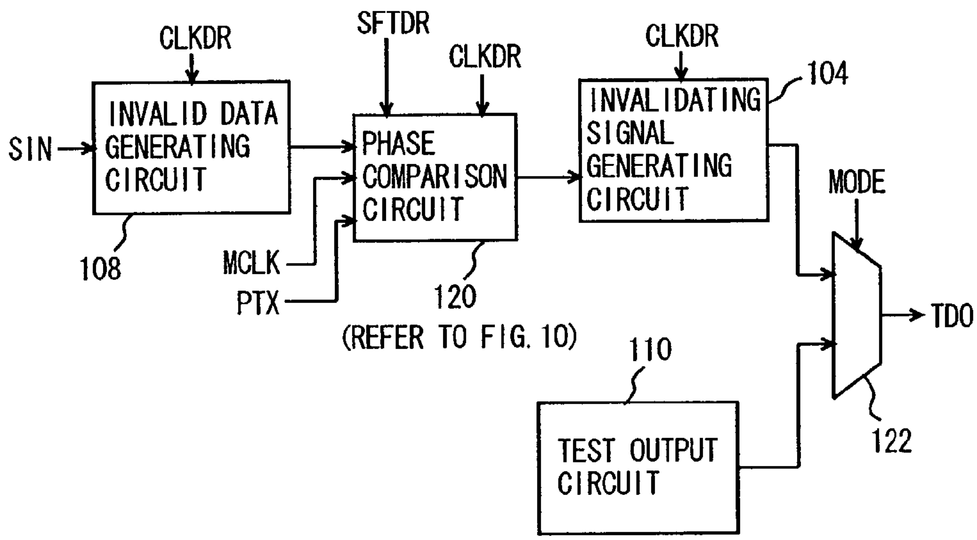
F I G. 35
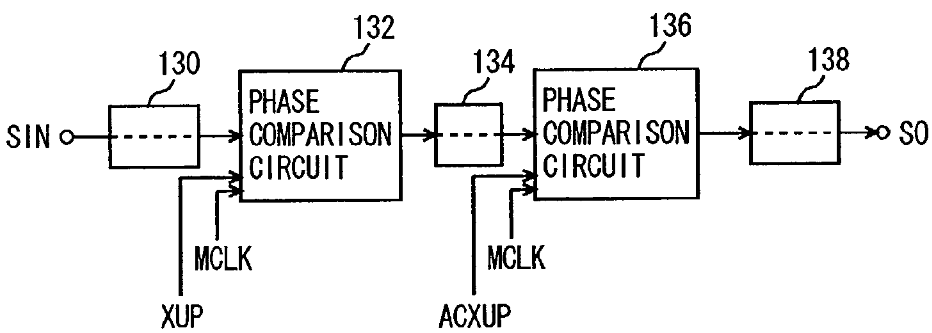

F I G. 3 6 PRIOR ART
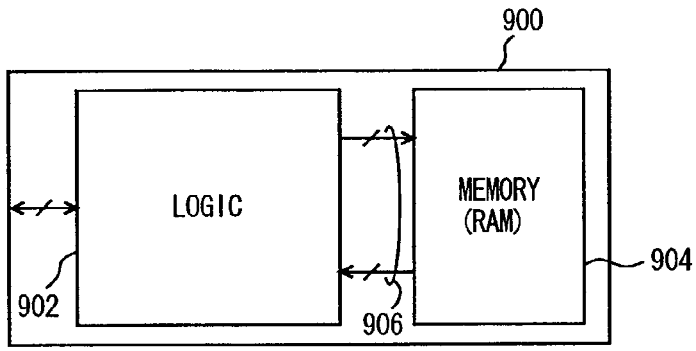
F I G. 3 7 PRIOR ART
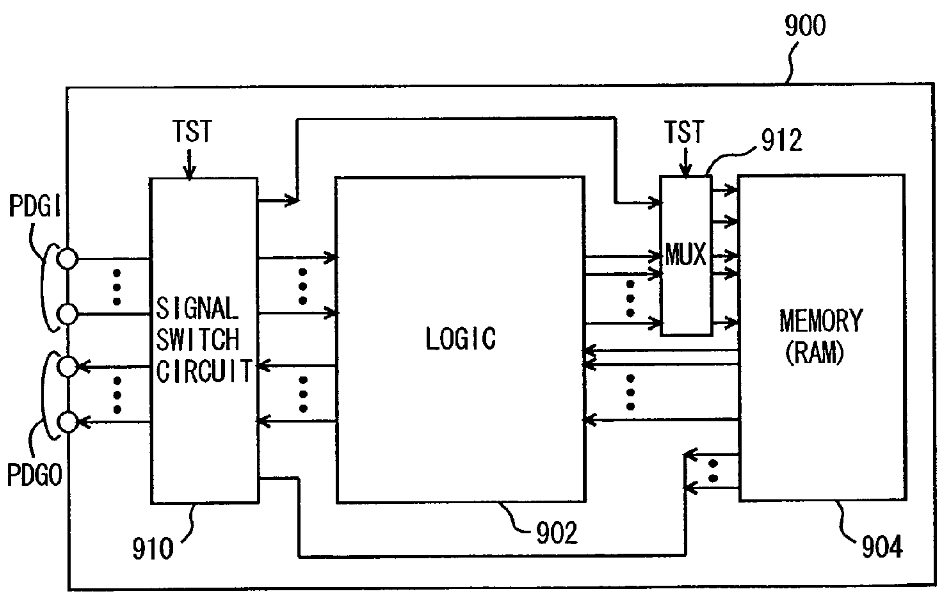

TEST CIRCUIT CAPABLE OF TESTING EMBEDDED MEMORY WITH RELIABILITY

BACKGROUND OF THE INVENTION

1. Field of the Invention

The present invention relates to a semiconductor integrated circuit device, and particularly, to a configuration for testing semiconductor memory device in a system LSI with a logic and the semiconductor memory device integrated on a common semiconductor substrate.

2. Description of the Background Art

FIG. 36 is a diagram schematically showing an overall configuration of a conventional semiconductor integrated circuit device. In FIG. 36, a semiconductor integrated circuit device 900 includes: a logic 902 performing a prescribed logical processing; and a memory 904 storing at least data necessary for the processing by the logic 902. Logic 902 and memory 904 are integrated on the same semiconductor substrate and logic 902 and memory 904 are interconnected through on-chip interconnection lines 906.

Memory 904 is integrated together with logic 902 on the same semiconductor chip and called an embedded memory. Semiconductor integrated circuit device 900 shown in FIG. 36 generally further includes an analog circuit, a memory of a different kind and other(s), which are integrated with memory 904 and logic 902, to constitute a system LSI implementing one system on one chip.

In semiconductor integrated circuit device 900, on-chip interconnection lines 906 interconnecting logic 902 and memory 904 are smaller in load as compared with an on-board interconnection line or the like, to enable a signal/data to be transferred between logic 902 and memory 904 at high speed. Furthermore, logic 902 and memory 904 are integrated on the same semiconductor substrate and on-chip interconnection lines 906 are coupled with input/output nodes of memory 904. Therefore, with on-chip interconnection lines 906, a data bus width can be widened to transfer data at high speed, due to no restriction by the pitch requirement of pin terminals.

Semiconductor integrated circuit device 900 with logic 902 and memory 904 integrated on the same semiconductor substrate in such a way is widely used as a system LSI in applications such as portable equipment and others.

In such a semiconductor integrated circuit device, in order to secure reliability of a product, it is required to perform a test thereon after fabrication. Logic 902 is coupled to an external device through pin terminals and can be directly accessed from the external device. Memory 904, however, can be externally accessed only through logic 902.

Therefore, in order to enable an external test apparatus to access memory 904 directly, there is usually provided a test interface circuit for accessing directly memory 904 externally.

FIG. 37 is a diagram schematically showing a configuration of a test interface circuit in a conventional semiconductor integrated circuit device. In FIG. 37, the test interface circuit includes: a signal switch circuit 910 for coupling an input signal pad group PDGI and an output pad group PDGO to one of logic 902 and memory 904 according to a test mode instructing signal TST; and a selection circuit (MUX) 912 for selecting one of a signal transferred from signal switch circuit 910 and a signal outputted from logic 902, in accordance with test mode instructing signal TST, to apply the selected one to memory 904. Usually, data read out from memory 904 bypasses selection circuit 912 and are transferred to logic 902 and signal switch circuit 910. This is to done to avoid a signal propagation delay in selection circuit 912 in data read operation.

With signal switch circuit 910 and selection circuit 912 as shown in FIG. 37, the external test apparatus can access memory 904 directly through pad groups PDGI and PDGO, signal switch circuit 910 and selection circuit 912. Therefore, without need of testing memory 904 through logic 902, a test can be performed on characteristics of memory 904, such as whether or not it correctly stores data.

However, since access to memory 904 is made through signal switch circuit 910 and selection circuit 912, a problem arises that for example, set-up and hold times, an access time and the like of memory 904 cannot be correctly measured. That is, the set up and hold times cannot be correctly measured due to an interconnection delay and a skew along this internal transfer path. Furthermore, since data read out from memory 904 is detected externally by an external test apparatus through signal switch circuit 910, such a problem arises that an access time in data reading when logic 902 accesses memory 904 cannot be correctly measured.

Moreover, since there is a difference between an internal data bus width and the number of pin terminals, all data bits of memory 904 cannot be read out in parallel to external pin terminals in data write/read. Therefore, it is required to sequentially select data bits for transference externally in data read, disabling correct measurement of an access time.

Similarly to this, set up and hold times of data in data writing cannot be measured. This problem associated with the set up and hold times occurs not only on data but also on an address signal and a control signal instructing an operation mode in a similar manner.

Memory 904 is generally a synchronous memory operating in synchronization with a clock signal and if the set up and hold times can not be guaranteed, there arises a possibility of failing to correctly take in a command and write data. Moreover, with respect to an access time either, there is a possibility that a high speed operation of logic 902 cannot be insured if correct measurement on an access time cannot be performed in data transfer from memory 904 to logic 902 in a case where data is transferred in synchronization with a high speed clock signal.

SUMMARY OF THE INVENTION

It is an object of the present invention to provide a semiconductor integrated circuit device capable of correctly measuring timing conditions such as setup and hold times and an access time of an embedded memory using an external test apparatus.

It is another object of the present invention to provide a logic merged memory capable of correctly measuring timing conditions of a signal associated with access to the memory using a test apparatus.

It is still another object of the present invention to provide a semiconductor integrated circuit device with an embedded memory capable of correctly measuring setup and hold times and an access time of a desired signal/data of the embedded memory with high precision without increasing a test circuit scale.

A semiconductor integrated circuit device according to a first aspect of the present invention includes: a hold circuit receiving and holding a test signal applied from an outside of the semiconductor integrated circuit device; and an alteration circuit selectively altering a logic level of the test signal held in the hold circuit, according to a control signal applied externally, to transmit the test signal to a semiconductor memory device in the semiconductor integrated circuit device.

A semiconductor integrated circuit device according to a second aspect of the present invention includes: a scan circuit having a plurality of register circuits for transferring serially a test control signal applied externally; and a select circuit for selecting one of a signal outputted from a semiconductor memory device and the test control signal to be transferred serially for transference to a register circuit of the scan circuit.

A semiconductor integrated circuit device according to a third aspect of the present invention includes: a logic circuit; a memory circuit formed on a common semiconductor substrate with the logic circuit and storing at least data processed by the logic circuit; a test circuit for transferring a test signal applied externally in synchronization with a test clock signal; a test signal modifying circuit for modifying a signal outputted by the test circuit to output according to a control signal externally applied asynchronously to the test clock signal; and a select circuit for selecting one of an output signal of the logic circuit and an output signal of the test signal modifying circuit according to a test mode instructing signal for transference to the memory circuit.

By providing a circuit for modifying and outputting a test signal according to a control signal corresponding to each of input nodes of the semiconductor memory device, a valid signal and an invalid signal can be generated, according to a control signal, to transmit to each of the input nodes of the semiconductor memory device. With such a configuration, by monitoring a phase difference between the control signal and a clock signal in an external test apparatus, set-up and hold times of a signal can be measured for each of the input nodes of the semiconductor memory device.

Moreover, by taking in an output signal from the memory into a register circuit, a time point when data is outputted from the memory can be detected. Therefore, an access time can be measured with ease (an access time can be measured by measuring a time period required for the taking-in after application of a data output command).

By transferring a test signal and a test data from different terminals to individually control a modifying operation on each of the test signal and the test data in accordance with an asynchronous control signal and a test mode switch signal, setup and hold times of a signal can be measured individually for each of various data patterns, thereby to validate the detection of presence or absence of a failure and to identify a cause for the failure. Moreover, in access to the memory circuit according to a signal such as an address/command, by selectively making data valid or invalid according to an asynchronous signal, the setup and hold times of the data can be measured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram schematically showing an overall configuration of a semiconductor integrated circuit device according to a first embodiment of the present invention;

FIG. 2 is a diagram schematically showing a configuration of an output stage of a logic circuit shown in FIG. 1;

FIG. 3 is a diagram schematically showing a configuration of an output stage of a test circuit shown in FIG. 1;

FIG. 4 is a diagram schematically showing a configuration of an invalid data generating circuit shown in FIG. 1;

FIG. 5 is a diagram schematically showing a configuration of a select circuit shown in FIG. 1;

FIG. 6 is a timing chart representing an operation in a semiconductor integrated circuit device according to in a first embodiment of the present invention;

FIG. 7 is a diagram showing an example of generation of a memory clock signal and a test clock signal in the first embodiment of the present invention;

FIG. 8 is a diagram schematically showing another example of generation of a memory clock signal and a test clock signal in the first embodiment of the present invention;

FIG. 11 is a timing chart representing operation of the phase comparison circuit shown in FIG. 10;

FIG. 12 is a diagram schematically showing a configuration of a main section of a semiconductor integrated circuit device according to a third embodiment of the present invention;

FIG. 13 is a diagram schematically showing a configuration of a scan register circuit and an invalid data generating circuit shown in FIG. 12;

FIG. 14 is a diagram schematically showing a configuration of the scan register circuit of a semiconductor integrated circuit device according to a fourth embodiment of the present invention;

FIG. 15 is a diagram schematically showing a modification of the fourth embodiment of the present invention;

FIG. 16 is a diagram schematically showing a configuration of a scan register circuit according to a fifth embodiment of the present invention;

FIG. 17 is a timing chart representing an operation of the scan register circuit shown in FIG. 16;

FIG. 18 is a timing chart for explaining an operation for correcting a phase difference in the scan register circuit shown in FIG. 16;

FIG. 19 is a diagram schematically showing an overall configuration of a semiconductor integrated circuit device according to a sixth embodiment of the present invention;

FIG. 22 is a diagram schematically showing a modification of the sixth embodiment of the present invention;

FIG. 24 is a diagram schematically showing an overall configuration of a semiconductor integrated circuit device according to an eighth embodiment of the present invention;

FIG. 30 is a diagram schematically showing a configuration of a main portion of a test interface circuit according to a ninth embodiment of the present invention;

FIG. 33 is a timing chart representing an operation of a test interface circuit shown in FIG. 30;

FIG. 34 is a diagram schematically showing a configuration of a main portion of a test interface circuit according to a tenth embodiment of the present invention;

FIG. 35 is a diagram schematically showing a configuration of a modification of the tenth embodiment of the present invention;

FIG. 36 is a diagram schematically showing an overall configuration of a conventional semiconductor integrated circuit device; and FIG. 37 is a diagram schematically showing a configuration of a test interface circuit in the conventional semiconductor integrated circuit.

DESCRIPTION OF THE PREFERRED EMBODIMENTS

First Embodiment

Figure 9:
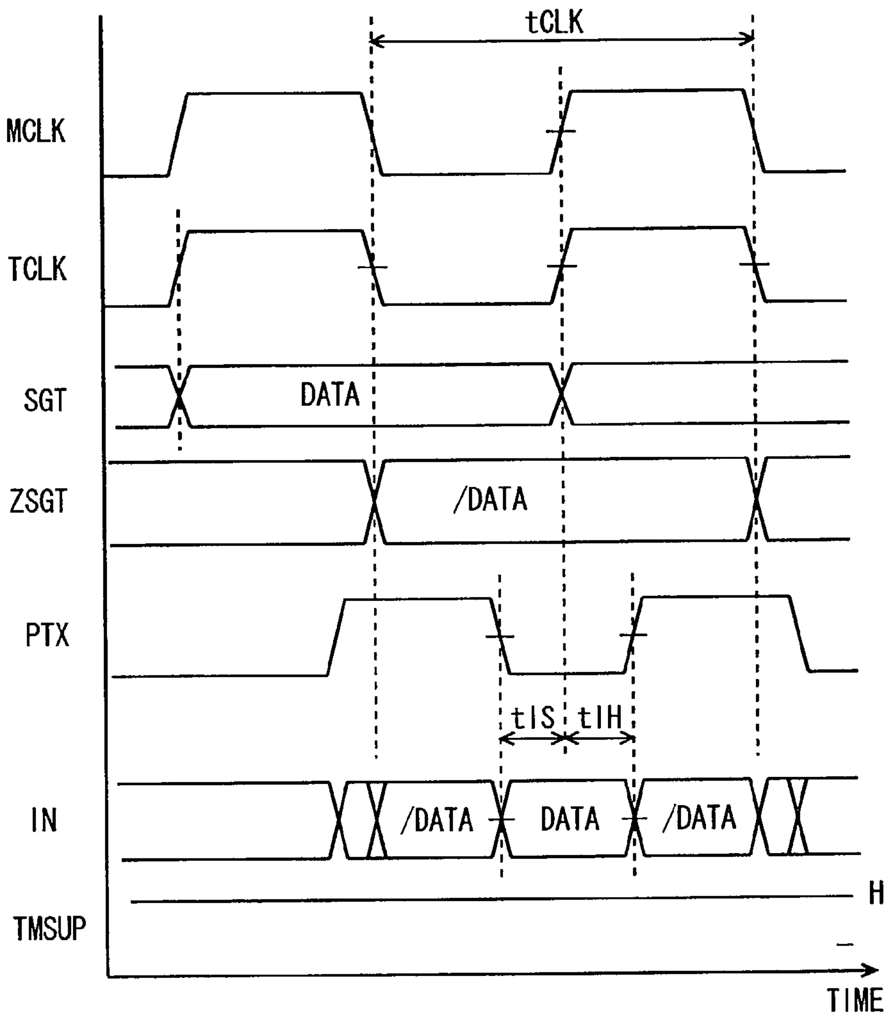
FIG. 9 is a timing chart representing an operation in a semiconductor integrated circuit device in a case of clock generation circuitry shown in FIG. 8.

FIG. 1 is a diagram schematically showing an overall configuration of a semiconductor integrated circuit device according to a first embodiment of the present invention. In FIG. 1, a semiconductor integrated circuit device 1 includes: a logic circuit 2 performing a prescribed processing; a memory (RAM) 3 storing data required by logic circuit 2; a test circuit 5 communicating a test signal and data with a test apparatus outside semiconductor integrated circuit device 1 in a test mode; an invalid data generating circuit 6 selectively setting a test signal from test circuit 5 to an invalid state according to an asynchronous control signal PTX; a signal switch circuit 4 selectively coupling logic circuit 2 and test circuit 5 to external pads according to a test mode instructing signal MTEST; and a select circuit 7 selectively coupling output signals of logic circuit 2 and invalid data generating circuit 6 to memory 3 according to test mode instructing signal MTEST.

Data read out from memory 3 bypasses select circuit 7 and is applied directly to logic circuit 2 and test circuit 5 (the paths are not shown).

Test circuit 5 transfers a test signal applied externally through signal switch circuit 4 in synchronization with a test clock signal TCLK in the test mode.

Logic circuit 2 performs processing of a signal/data and transfers a result of the processing in synchronization with a clock signal CLK, in operation.

In a normal operation mode, memory 3 receives clock signal CLK, and performs input/output of a signal/data in synchronization with clock signal CLK. In the test mode, a clock signal synchronous to test clock signal TCLK is applied to memory 3, which will be described later.

Asynchronous control signal PTX is a signal asynchronous to test clock signal TCLK and a memory clock signal and applied from an external test apparatus. A valid period of a test signal is determined according to asynchronous signal PTX, to set setup and hold times with respect to the memory clock signal.

Signal switch circuit 4 couples external pad PD to test circuit 5 in the test mode of memory 3, while coupling logic circuit 2 to external pad PD in the normal operation mode of memory 3 and in a test mode of logic circuit 2.

Select circuit 7 couples an output signal of invalid data generating circuit 6 to memory 3 when test mode instructing signal MTEST instructs the test mode of memory 3, and couples logic circuit 2 to memory 3 in the normal operation mode of memory 3 and in the test mode of logic circuit 2.

Invalid data generating circuit 6 includes circuits provided corresponding to respective input nodes of memory 3 and transfers a signal or data in synchronization with test clock signal TCLK. In addition, invalid data generating circuit 6 sets a valid period of a signal/data applied from test circuit 5 according to asynchronous control signal PTX in transfer of a signal to memory 3.

FIG. 2 is a diagram schematically showing a configuration of an output stage of logic circuit 2. In FIG. 2, logic circuit 2 includes a processing circuit **2*a* performing a prescribed logical processing; and a flip-flop 2*b* transferring an output signal of processing circuit 2*a* in synchronization with clock signal CLK. Flip-flop 2*b* includes: a latch circuit 12*a* taking in a received signal when clock signal CLK is at L level, and enters a latch state, when clock signal is at H level, to latch an output signal of processing circuit 2*a*; and a latch circuit 12*b* taking in an output signal of latch circuit 12*a*** when clock signal CLK is at H level, and enters a latch state when clock signal CLK is at L level.

Latch circuits **12*a* and 12*b* enter a through state in which an applied signal passes therethrough when a clock signal applied to clock input nodes E is at L level and H level, respectively. Latch circuits 12*a* and 12*b*** each are of a configuration similar to that of an ordinary latch circuit.

Therefore, as shown in FIG. 2, a signal SGL is outputted from logic circuit 2 in synchronization with a rise of clock signal CLK.

FIG. 3 is a diagram schematically showing a configuration of a signal output stage of test circuit 5 shown in FIG. 1. In FIG. 3, test circuit 5 includes: a test processing circuit **5*a* processing a test signal/data applied from an external test apparatus; and a flip-flop 5*b* transferring an output signal from test processing circuit 5*a*** according to test clock signal TCLK.

Test processing circuit **5*a* performs a processing such as an alteration of bit width of write data applied from a test apparatus. This is because in semiconductor integrated circuit device 1, the number of pads disposed externally and receiving write data is less than that of data input nodes of memory 3, and the external apparatus can not apply write data to memory 3 in parallel and simultaneously through the external pads. Therefore, the bit width of write data is altered internally so as to be equal to that of the input nodes of memory 3. For example, the external data bit width of semiconductor integrated circuit device 1 is 8 bits, while the bit width of transfer data of memory 3 is 128 bits or 256 bits. A difference between the data bit width of the external pads PD and the transfer data bit width of memory 3** makes measurement on setup and hold times of data difficult conventionally.

Test signals may include an address signal and a control signal. The address signal and the test signal may be individually applied through the external pads PD. In a case of the address signal, address signal bits at the same logic level may be generated in duplication, depending on the number of available external pads.

Control signals are individually applied in order to instruct an operating mode of the memory. Manner of application of an address signal, a control signal and data are determined suitably according to the number of pads available in a memory test and a configuration of an external test apparatus.

Flip-flop 5*b* includes: a latch circuit 15*a* entering a through state in synchronization with a fall of test clock signal TCLK, while entering a latch state in response to a rise the clock signal to latch an output signal of test processing circuit 5*a*; and a latch circuit 15*b* entering a through state, when test clock signal TCLK is driven to H level, to pass an output signal of latch circuit 15*a* therethrough, while entering a latch state, when test clock signal TCLK is driven to L level, to latch an output signal of latch circuit 15*a*. A signal/data SGT is outputted from latch circuit 15*b*.

Latch circuits 15*a* and 15*b* are similar in configuration to latch circuits 12*a* and 12*b*.

Accordingly, transfer of a signal/data is also performed in test circuit 5 according to test clock signal TCLK and an output signal of test circuit 5 is changed in synchronization with a rise of test clock signal TCLK. In invalid data generating circuit 6, a valid period (a definite period) of a signal/data transferred according to test clock signal TCLK is set according to asynchronous control signal PTX.

FIG. 4 is a diagram showing an example of a configuration of invalid data generating circuit 6 shown in FIG. 1. In FIG. 4, invalid data generating circuit 6 includes: a latch circuit 6*a* taking in a received signal, when test clock signal TCLK is at L level, to latch the received signal; a multiplexer 6*d* selecting one of output signal SGT from flip-flop 5*b* at the preceding stage of test circuit 5 and an output signal of latch circuit 6*a* according to a test setup instructing signal TMSUP; a register 6*b* storing data determining validation/invalidation of an output signal; a NAND circuit 6*c* receiving storage data of register 6*b* and asynchronous control signal PTX; an inverter 6*e* receiving an output signal ZSGT of multiplexer 6*d*; and an EXOR circuit 6*f* receiving output signal /ZSGT of inverter 6*e* and an output signal of NAND circuit 6*c* to generate a test signal TEOUT applied to memory 3 in the test mode.

Latch circuit 6*a* is used for delaying test signal SGT by a half cycle of test lock signal TCLK in the test mode described later.

Data VD determining validation/invalidation is stored into register 6*b* through a circuit described in detail later. An output signal of NAND circuit 6*c* is driven to H level when data VD stored in register 6*b* is at L level to invalidate asynchronous control signal PTX. On the other hand, NAND circuit 6*c* operates as an inverter, when data VD stored in register 6*c* is at H level, to change the output signal of NAND circuit 6*c* according to asynchronous control signal PTX.

EXOR circuit 6*f* operates as an inverter when an output signal of NAND circuit 6*c* is at H level, and operates as a buffer circuit when an output signal of NAND circuit 6*c* is at L level.

Therefore, a valid period of a test signal is a period when test signal TEOUT applied to memory 3 is at the same logic level as test signal SGT applied externally, while an invalid period is a period when the logic level of test signal TEOUT is inverted.

The circuit configuration shown in FIG. 4 is provided corresponding to each of the input nodes of memory 3, and test output signal TEOUT is transmitted to a corresponding input node of memory 3 in the test mode. Therefore, a signal/data for a required input node of memory 3 can be changed by data VD stored in register 6*b* according to asynchronous control signal PTX and thereby, setup and hold times of desired signal/data of memory 3 can be measured. A valid/invalid period of test signal TEOUT is set according to asynchronous control signal PTX, and therefore no problem arises even if test data bits applied externally are copied or duplicated to produce write data to memory 3, for example.

FIG. 5 is a diagram schematically showing a configuration of select circuit 7 and memory 3 shown in FIG. 1. In FIG. 5, select circuit 7 includes: multiplexers MX0 to MXn provided corresponding to the signals of a signal group SGLG applied from logic circuit 2 and of an output signal group TEOUTG applied from invalid data generating circuit 6. In FIG. 5, multiplexers MX0 to MXn select one group of output signals SGL0 to SGLn from a logic circuit and test output signals TEOUTO to TEOUTN from invalid data generating circuit 6, to generate internal signals IN0 to INn.

Memory 3 includes: input circuits IK0 to IKn provided corresponding to respective multiplexers MX0 to MXn. Input circuits IK0 to IKn take in applied signals in synchronization with a clock signal.

In the configuration of invalid data generating circuit shown in FIG. 4, by setting validation/invalidation of test output signal TEOUT according to data stored in register 6*b*, signals applied to respective input circuits IK0 to IKn of memory 3 can have their valid state/invalid state set individually. Therefore, since the valid state corresponds to a definite period of an input signal, measurement on set up and hold times of a specific input signal can be made possible.

A configuration is shown, as an example, in which test clock signal TCLK is inverted through inverter 19 to generate clock signal MCLK to memory 3. However, as a configuration for applying a clock signal to memory 3, any one of configurations described below may be employed instead.

Clock signal MCLK for memory 3 in the test mode may be generated through a select circuit 7 for selecting either of clock signal CLK for a logic and an output signal from inverter 19.

Furthermore, in a case in which memory 3 is operated in synchronization with test clock signal TCLK in the test mode for performing an ordinary functional test or the like, a configuration may be employed in which test clock signal TCLK bypasses inverter 19 and is applied to memory 3.

Moreover, as shown with broken lines in FIG. 5, mutually complementing clock signals (not shown) may be applied from an external test apparatus. In FIG. 5, a configuration is shown, as an example, in which a memory clock signal complementary to test clock signal TCLK is applied to clock input pad PDCL. In this case, clock input pad PDCL may be a pad to which a normal logic clock signal is inputted, or may be another pad. In the case of another pad, in memory 3, a configuration is adopted in which a signal obtained by performing a logical OR operation on the normal logic clock signal and a complementary test clock signal is applied as a memory clock signal.

Input circuits IK0 to IKn take in applied signals in synchronization with a rise of memory clock signal MCLK. Now, description will be given of an operation of the circuits shown in FIGS. 1 to 5 with reference to a signal waveform diagram shown in FIG. 6.

In the test mode of memory 3, external pad PD and a logic are disconnected from each other, while test circuit 5 is coupled to the external pad by signal switch circuit 4 according to test mode instructing signal MTEST, and a test signal, test clock signal TCLK and asynchronous control signal PTX are applied to test circuit 5. Furthermore, an output port (a user port) of logic circuit 2 is disconnected from memory 3 by select circuit 7, while test output signal TEOUT (test output signal group TEOUTG) from test circuit 5 modified by invalid data generating circuit 6 is transmitted to memory 3.

Memory clock signal MCLK and test clock signal TCLK applied to memory 3 are clock signals with the same frequency, but are signals of opposite phases and out of phase from each other by a half cycle.

In multiplexer 6*d* shown in FIG. 4, test mode setup signal TMSUP is set at L level to select output signal SGT of test circuit 5. In test circuit 5, since latch circuit 15*b* at the output stage of flip-flop 5*b* enters a through state in synchronization with a rise of test clock signal TCLK, output signal SGT of test circuit 5 changes in synchronization with a rise of test clock signal TCLK. Latch circuit 15*a* stays in a latch state during a period when test clock signal TCLK is at H level, during which an output signal thereof does not change. When test clock signal TCLK is driven to L level, latch circuit 15*b* enters a latch state. Therefore, a logic state of output signal SGT of test circuit 5 is held during a period of one test clock cycle tCLK of test clock signal TCLK.

In a case when valid/invalid data VD is set at H level in register 6*b* shown in FIG. 4, NAND circuit 6*c* operates as an inverter. When asynchronous control signal PTX is raised to H level, an output signal of NAND circuit 6*c* attains L level (data VD of register 6*b* is at H level). Therefore, in this state, EXOR circuit 6*f* operates as a buffer circuit to generate test output signal TEOUT according to output signal ZSGT of inverter 6*e*. Therefore, an inverted signal (/DATA) of an output signal SGT (DATA) of test circuit 5 is transmitted to memory 3 as input signal IN.

Then, when asynchronous control signal PTX is set to L level, an output signal of NAND circuit 6*c* is driven to H level to cause EXOR circuit 6*f* to operate as an inverter. Therefore, test signal TEOUT in a state corresponding to a state (DATA) of output signal SGT of test circuit is generated during a period when asynchronous control signal PTX is at L level. Therefore, a signal (DATA) with the same logic state as a state (DATA) of a signal set in test circuit 5 is transmitted as input signal IN to memory 3.

Then, when asynchronous control signal PTX is again raised to H level, a logic level of signal IN applied to memory 3 is inverted. Hence, a signal with the same logic state as a logic state of output signal SGT of test circuit 5 is applied to memory 3 during a period when asynchronous control signal PTX is at L level. This period corresponds to a period when an input signal to memory 3 is in a definite state. A period when an input signal to memory 3 is in an inverted logic state of output signal SGT of test circuit 5 corresponds to a period when the input signal is in an invalid state.

Memory 3 takes in received input signal IN in synchronization with a rise of memory clock signal MCLK. Hence, by changing asynchronous control signal PTX with a fall of test clock signal TCLK being a center, a setup time tIS and a hold time tIH can be measured.

Specifically, by adjusting timings of falls of asynchronous control signal PTX and test clock signal TCLK in an external test apparatus and determining whether or not write/read of data is correctly performed, setup and hold times can be correctly measured. That is, when write/read of data is performed with setup time tIS shortened, a setup time in the test cycle immediately preceding the test cycle when error of data is detected is a setup time of memory 3. Likewise, as for hold time tIH, a test is performed with hold time tIH shortened, and a hold time in the test cycle immediately preceding the test cycle when error is detected can be determined as a hold time of memory 3. Determination on error of data is performed in a general functional test of performing write/read of data on a memory.

When data at L level is stored into register 6*b* as valid/invalid data VD, an output signal of NAND circuit 6*c* is fixed at H level regardless of a logic level of asynchronous control signal PTX. Therefore, in this case, since EXOR circuit 6*f* operates as an inverter, input signal IN becomes a signal with the same logic level as a logic level of output signal SGT of test circuit 5. Hence, in this case, if a functional test is performed to write/read data, a setup time and a hold time are always ½ times clock cycle tCLK, resulting no setup/hold failure. Therefore, setup/hold times can not be measured.

Accordingly, by providing register 6*b*, setup/hold times can be measured only at an input node necessary for a signal of memory 3. Setup/hold times of the respective signals can be measured.

In the signal waveform diagram shown in FIG. 6, test clock signal TCLK and memory clock signal MCLK applied to memory 3 are opposite in phase to each other. In a case where complementary signals can be applied externally, as shown in FIG. 7, complementary clock signals CLKE and ZCLKE are applied externally to clock input pad PDCL and test clock input pad PDTC, respectively, to generate memory clock signal MCLK and test clock TCLK, alternative to a configuration using inverter shown in FIG. 5. Thereby, an influence of a gate delay time of inverter 19 is prevented from being exerted on measurement of setup/hold times.

Modification

Two cases are considered, one where complementary clock signals cannot be generated due to limitation in a tester, and the other where only one pad can be used as a clock input pad. In such cases, memory clock MCLK and test clock signal TCLK are generated from common clock signal CLKE. In this case, clock signal CLKE is applied from a tester commonly to clock input pad PDCL and test clock input pad PDTC or to a common clock pad. In this case, memory clock signal MCLK and test clock signal TCLK become a clock signal the same in phase, and therefore, memory clock signal MCLK cannot be raised at the center of a window of output signal SGT of test circuit 5 applied to the internally provided memory. Therefore, in a case where only one clock signal can be used in a test like this, test mode setup signal TMSUP shown in FIG. 4 is set to H level to apply a latch signal of latch circuit 6*a* to memory 3 through multiplexer 6*d*.

FIG. 9 is signal waveforms representing an operation in a case where memory clock signal MCLK and test clock signal TCLK are in phase. As shown in FIG. 9, in a case where memory clock signal MCLK and test clock signal TCLK are phase-synchronized and are in phase with each other, test mode setup signal TMSUP is set to H level and an output signal of latch circuit 6*a* is selected by multiplexer 6*d* shown in FIG. 4. Output signal SGT of test circuit 5 changes in synchronization with a rise of test clock signal TCLK.

On the other hand, latch circuit 6*a* a through state in synchronization with L level of test clock signal TCLK, and enters a latch state in synchronization with H level of test clock signal TCLK. Therefore, in this case, output signal ZSGT of inverter 6*e* changes in synchronization with a fall of test clock signal TCLK. Hence, the center of a window of output signal ZSGT of inverter 6*e* corresponds to a rising edge of memory clock signal MCLK. By adjusting a L level period of asynchronous control signal PTX with a rise of test clock signal TCLK or memory clock signal MCLK being the center, setup time tIS and hold time tIH of input signal IN for memory 3 can be changed. Therefore, even in a case where memory clock signal MCLK and test clock signal TCLK are in phase with each other, setup time tIS and hold time tIH of input signal IN for memory 3 can be measured. In this case, a phase relationship between asynchronous control signal PTX and a rise of test clock signal TCLK is the same as in a case where memory clock signal MCLK and test clock signal TCLK is opposite in phase to each other, and therefore, similarly, by changing a valid period of an input signal to memory 3 to perform write/read of data and to detect whether or not error occurs in data read, setup and hold times can be measured.

As described above, according to the first embodiment, invalid data generating circuits are provided corresponding to the respective input nodes of memory to alter the states of transfer signals to memory with the asynchronous control signal and to allow the setup and hold times of a signal transmitted to memory to be set through control of a logic state of asynchronous control signal. Thus, the setup and hold times of an input signal to memory 3 can be measured with correctness.

It should be noted that memory test setup signal TMSUP is applied from an external tester through a signal switch circuit. However, in a case where a command decode circuit is provided in the test circuit, a logic level of memory test setup signal TMSUP may be altered using the command decode circuit.

Second Embodiment

Figure 10:
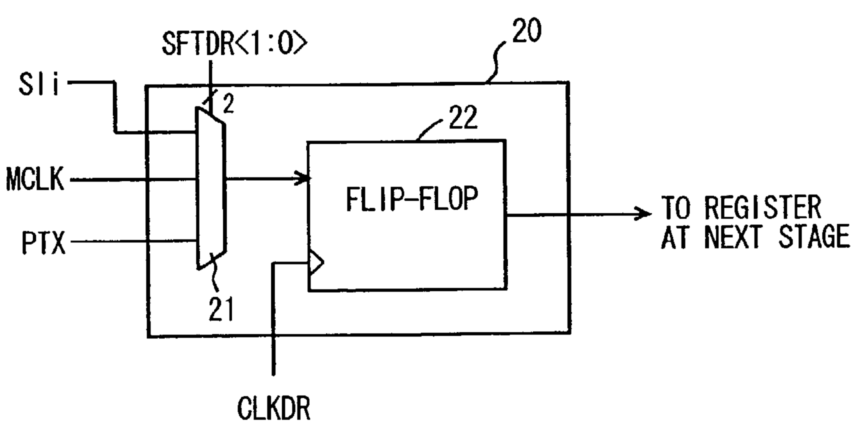
FIG. 10 is a diagram schematically showing a configuration of a phase comparison circuit in a second embodiment of the present invention.

FIG. 10 is a diagram schematically showing a configuration of a main portion of a semiconductor integrated circuit according to a second embodiment of the present invention. In FIG. 10, there is provided a phase comparison circuit 20 for detecting an actual phase difference between memory clock signal MCLK and asynchronous control signal PTX. Phase comparison circuit 20 is constituted of a scan register constituting a scan path described later. In FIG. 10, phase comparison circuit 20 includes: a select circuit 21 selecting one of an internally applied serial signal/data SIi, memory clock signal MCLK and asynchronous control signal PTX according to a select signal SFTDR <1:0>; and a flip-flop 22 taking in a signal selected by select circuit 21 according to a gating signal CLKDR. Flip-flop 22 constitutes a scan path to transfer a taken-in signal to a register circuit at the next stage. Gating signal CLKDR is a signal asynchronous to memory clock signal MCLK, asynchronous control signal PTX and test clock signal TCLK.

Flip-flop 22 takes in and latches a signal applied from select circuit 21 in response to a rise of gating signal CLKDR. Flip-flop 22 may be constituted of, for example, a D flip-flop. Furthermore, gating signal CLKDR may be formed of a one shot pulse with a short pulse width, and flip-flop 22 may be configured to take in an output signal of select circuit 21 during a period when gating signal CLKDR is at H level, and to enter a latch state when gating signal CLKDR is driven to L level. In such configurations, precision of a phase difference between memory clock signal MCLK and asynchronous control signal PTX is determined by a pulse width of gating signal CLKDR.

Furthermore, flip-flop 22 may be configured to enter a latch state in response to a rise of gating signal CLKDR.

FIG. 11 is a timing chart representing an operation of the phase comparison circuit shown in FIG. 10. In FIG. 11, there is shown as an example an operation in a case where flip-flop 22 takes in and latches a received signal in response to a rise of gating signal CLKDR. Description will now be given of operation in phase comparison circuit 20 shown in FIG. 10 below with reference to the timing chart shown in FIG. 11.

First of all, for example, memory clock signal MCLK is selected by select signal SFTDR <1:0>. Then, an activation timing of gating signal CLKDR (CLKDRM) is sequentially shifted to cause flip-flop 22 to take in memory clock signal MCLK according to gating signal CLKDR (CLKDRM). In FIG. 11, at a time T0, a signal at H level is taken into flip-flop 22. The signal taken in flip-flop 22 is outputted to the outside by applying a transfer clock signal, instead of gating signal, to determine a rise timing of memory clock signal MCLK in an external tester.

Then, select signal SFTDR <1:0> is altered to cause select circuit 21 to select asynchronous control signal PTX. Asynchronous control signal PTX is changed at the same timing as in measurement on setup and hold times, and then an activation timing of gating signal CLKDR(CLKDRP) to be sequentially is shifted to cause flip-flop 22 to take in asynchronous control signal PTX. Data stored in flip-flop 22 is monitored externally to identify that asynchronous control signal PTX transitions from a logical high (H) level to a logical low (L) level at time TS and transitions from L level to H level at time TH.

An activation timing of gating signal CLKDR (shown by a rise to H level in FIG. 11) is determined using a reference clock. Therefore, using a time T0 at a rise timing of memory clock signal MCLK and a fall time point TS and a rise time point TH of asynchronous control signal PXT, an actual phase difference between memory clock signal MCLK and asynchronous control signal PTX can be detected. Actual phase differences (TH–T0) and (T0–TS) correspond to a hold time and a setup time of the memory, respectively.

Therefore, by providing phase comparison circuit 20 in the semiconductor integrated circuit device, hold and setup times set by a tester can be corrected using measured data thereof in each integrated circuit device. Consequently, timing correction of asynchronous control signal PTX generated from a test apparatus can be performed by phase comparison circuit 20 provided in the semiconductor integrated circuit device, to achieve a highly precise measurement of a changing timing of a signal (setup and hold times).

In phase comparison circuit 20, a phase difference between memory clock signal MCLK and asynchronous control signal PTX is simply detected. That is, a time difference in rise/fall between memory clock signal MCLK and asynchronous control signal PTK is measured to obtain a phase difference and to detect a deviation to the phase difference between memory clock signal MCLK and asynchronous control signal PTK outputted by a tester. Using a time deviation specific to a semiconductor integrated circuit between memory clock signal MCLK and asynchronous control signal PTX, correction is made when measurement on a setup time and a hold time is performed. Therefore, since a time deviation between memory clock signal MCLK and asynchronous control signal PTX is the same for all time widths of asynchronous control signal PTX, there is no need to perform this phase comparison in each test with each individual time width (setup and hold times) of asynchronous control signal PTX.

It should be noted that in phase comparison circuit 20 shown in FIG. 10, a register circuit constituting a scan path, described later, are used. However, phase comparison circuit 20 has only to be able to detect a phase difference between memory clock signal MCLK and asynchronous control signal PTX in a semiconductor integrated circuit device. Therefore, alternatively, the comparison circuit may be provided in the test circuit, and the data stored in flip-flop 22 may be outputted through signal switch circuit 4 to the outside according to a specific output instructing signal. Therefore, phase comparison circuit 20 may be exclusively provided in the test circuit.

As described above, according to the second embodiment of the present invention, a phase comparison circuit detecting a phase difference between memory clock signal MCLK and asynchronous control signal PTX is provided in the semiconductor integrated circuit device. By correcting setup and hold times, determined through a functional test, according to an actual phase difference in each individual semiconductor integrated circuit device, measurement on setup and hold times can be achieved with correctness and high precision.

Third Embodiment

FIG. 12 is a diagram schematically showing a main portion of a semiconductor integrated circuit according to a third embodiment of the present invention. In FIG. 12, in order to store data into register circuit 6*b* storing invalid data included in invalid data generating circuit 6, a scan register circuit 30 is provided. Scan register circuit 30 includes register circuits connected in series, and a serial input signal SI is sequentially transferred according to transfer clock signal CLKDR.

Invalid data generating circuit 6 generates test signals TEOUTG corresponding to respective input nodes of memory 3. Therefore, the input nodes of memory 3 is large in number and the number of registers (register 6*b* shown in FIG. 4) storing invalid data VD included in invalid data generating circuit 6 also increases. Invalid data is serially transferred to many registers 6*b* through scan register circuit 30 to store data. With such a configuration, it is merely required to sequentially transfer serial signal SI according to transfer clock signal CLKDR through one pad externally. Thus, regardless of the number of input nodes of memory 3, necessary conditions for a test can be set with a small number of signal input nodes.

FIG. 13 is a diagram schematically showing configurations of invalid data generating circuit 6 and scan register circuit 30 shown in FIG. 12. In FIG. 13, invalid data generating circuit 6 includes registers 6*b*0 to 6*b*n provided corresponding to respective test output signals TEOUT. Registers 6*b*0 to 6*b*n each takes in and stores applied data according to an update clock signal UPDT. NAND circuits 6*c*0 to 6*c*n are provided corresponding to registers 6*b*0 to 6*b*n. NAND circuits 6*c*0 to 6*c*n each correspond to NAND circuit 6*c* shown in FIG. 4, and receive stored data in corresponding registers 6*b*0 to 6*b*n and asynchronous control signal PTX.

Output signals of NAND circuits 6*c*0 to 6*c*n are applied to respective EXOR circuits. In FIG. 13, there is representatively shown EXOR circuit 6*f*1 provided for NAND circuit 6*c*1. EXOR circuit 6*f*1 receives a corresponding output signal ZSGT of test circuit 5.

Scan register circuit 30 includes flip-flops F0 to Fn provided corresponding to respective registers 6*b*o to 6*b*n. Flip-flops F0 to Fn are serially connected to each other to take in and latches a signal applied from a flip-flop at a previous stage according to transfer clock signal CLKDR. A serial signal transfer path is constructed by flip-flops F0 to Fn.

Serial input signal SI is sequentially transferred through flip-flops F0 to Fn. When transfer clock signal CLKDR is toggled a prescribed number of times, valid/invalid data VD0 to VDn to be stored into registers 6*b*0 to 6*b*n can be stored into flip-flops FO to Fn. Then, update clock signal UPDT is activated to store valid/invalid data VD0 to VDn from outputs S0 to Sn of corresponding flip-flops F0 to Fn into registers 6*b*0 to 6*b*n.

Accordingly, in a configuration in which registers 6*b*0 to 6*b*n are provided corresponding to a great number of input nodes of the memory, by sequentially transferring serial input signal SI in synchronization with transfer clock signal CLKDR through one pad externally, desired valid/invalid data VD0 to VDn can be stored into a great number of registers 6*b*0 to 6*b*n using one pad. Transfer clock signal CLKDR or update clock signal UPDT may be applied from an external test circuit or alternatively, may be generated according to a decode result of an instruction in the semiconductor integrated circuit device based on test clock signal TCLK.

As described above, according to the third embodiment of the present invention, a scan register circuit is used in order to store valid/invalid data in registers provided corresponding to the respective input nodes of memory 3. Thus, necessary data can be stored into a great number of registers using one signal input pad.

It should be noted that a configuration may be adopted if there are a sufficient number of available pin terminals, in which a plurality of serial transfer paths are provided in parallel in scan register circuit 30 and serial signals are transferred in parallel through the respective paths. In this case, registers 6*b*0 to 6*b*n are divided into a plurality of groups in invalid data generating circuit 6 and registers of each group store output data of flip-flops of corresponding serial data transfer path according to update clock signal UPDT.

Fourth Embodiment

FIG. 14 is a diagram schematically showing a configuration of a main portion of a semiconductor integrated circuit device according to a fourth embodiment of the present invention. In FIG. 14, in scan register circuit 30, a select circuit 35 selecting one of memory clock signal MCLK, asynchronous control signal PTX, and an output signal of flip-flop (Fn−1) at a preceding stage of the last stage according to a 2 bit select signal SFTDR <1:0> is provided at a preceding stage of flip-flop Fn. The other components of the configuration shown in FIG. 14 are the same as those of the configuration shown in FIG, 13, corresponding components are denoted with the same reference numerals and characters and detailed descriptions thereof are not repeated.

In the configuration shown in FIG. 14, memory clock signal MCLK and asynchronous control signal PTX can be taken in into flip-flop Fn as a gating signal and sequentially transferred. Therefore, the flip-flop of phase comparison circuit 20 detecting a phase difference between memory signal MCLK and asynchronous control signal PTX can be commonly used as a flip-flop for transferring valid/invalid data, thereby achieving reduction in circuit occupancy area.

By commonly using the flip-flop of the phase comparison circuit as that of scan register circuit 30, a path for performing control of a phase comparison circuit and a control path for transfer of valid/invalid data in scan register 30 can be shared or unified. Thus, transfer of a result of phase comparison and transfer of valid/invalid data can be performed through the same signal input node externally, thereby achieving reduction in number of internal signal lines.

Modification

FIG. 15 is a diagram schematically showing a modification of the configuration of the fourth embodiment of the present invention. In FIG. 15, phase comparison circuit 20 shown in FIG. 10 is configured to receive and transfer an output signal of scan register circuit 30. Phase comparison circuit 20 includes: a select circuit 21 selecting one of memory clock signal MCLK, asynchronous control signal PTX and an output of flip-flop Fn according to a 2-bit select signal SFTDR <1:0>; and a flip-flop 22 taking in and latching an output signal of select circuit 21 according to transfer clock signal CLKDR.

The other components of the configuration shown in FIG. 15 is the same as those of the configuration shown in FIG. 13, corresponding components are attached with the same reference numerals and characters and detailed descriptions thereof are not repeated.

In the configuration shown in FIG. 15, a signal transfer path for transferring an output signal of a phase comparison circuit and a path for transferring valid/invalid data of scan register circuit 30 can be commonly used or unified. Therefore, a path of transferring an output signal of phase comparison circuit and a signal transfer path of scan path register circuit 30 are not required to be both provided independently of each other, thereby, achieving reduction in occupancy area of external signal transfer paths as a whole.

As described above, according to the fourth embodiment of the present invention, flip-flops constituting a phase comparison circuit for detecting a phase difference between the memory clock signal and the asynchronous signal is inserted in a transfer path for signal/data of a scan register circuit serially transferring data determining validation/invalidation of a test signal/data corresponding to the respective input nodes of a memory. Thus, reduction in number of signal interconnection lines of a path of transferring internal signals can be achieved and in addition, interconnection occupancy area can be decreased. Furthermore, flip-flops can be used commonly for transfer of valid/invalid data and for detection of a phase difference, thereby achieving not only reduction in number of circuit components but also decrease in area required for a test circuit.

Fifth Embodiment

FIG. 16 is a diagram schematically showing a configuration of a main portion of a semiconductor integrated circuit device according to a fifth embodiment of the present invention. In a configuration shown in FIG. 16, multiplexers MXP0 to MXPn are provided at respective preceding stages of flip-flops F0 to Fn in scan register circuit 30. Multiplexers MXP0 to MXPn are provided corresponding to output buffers OB0 to OBn of memory 3, respectively and selects corresponding output data bits Q0 to Qn, according to select signal SFTDR, for transmission to flip-flops F0 to Fn at the their respective subsequent stages. Multiplexers MXP0 to MxPn select serial input signal SI transferred through scan register circuit 30 according select signal SFTDR. By selecting and transmitting either of serial input signal SI and output data bits Q0 to Qn from memory 3 by multiplexers MXP0 to MXPn, a transfer path for output data can be simplified.

Furthermore, by transferring read data from memory 3 using the same path as transferring valid/invalid data determining a valid/invalid state of input nodes of memory 3, an occupancy area of a data transfer path in test can be reduced.

Moreover, output data bits Q0 to Qn from memory 3 are selected by multiplexers MXP0 to MXPn according to select signal SFTDR. In this state, by taking in data bits Q0 to Qn into flip-flops FO to Fn according to transfer clock signal (take in instructing signal) CLKDR, an access time can be measured. That is, by using transfer clock signal CLKDR as a gating signal, an access time of data read out from memory 3 in synchronization with memory clock signal MCLK can be measured.

Specifically, as shown in FIG. 17, a read command instructing data read in synchronization with memory clock signal MCLK is applied. With a rise timing of transfer clock signal CLKDR serving as a gating signal changed, data Q read out from memory 3 is taken into scan register circuit 30. When at a time Ta, it is determined that valid data is taken in, a time period tAC from a rise of memory clock signal MCLK till time Ta when valid data is outputted can be determined as an access time of memory 3.

It should be noted that in the signal waveform diagram shown in FIG. 17, it is shown that data Q from memory 3 is outputted in synchronization with a rise of memory clock signal MCLK. However, a configuration may be adopted in which data Q from memory 3 attains a valid state on a rise of memory clock signal MCLK and is outputted internally when memory clock signal MCLK is at L level. In this configuration as well, a method of measuring a timing of outputting valid data is the same, and data bits Q0 to Qn are take into flip-flops F0 to Fn in scan register circuit 30 at various timings with transfer clock signal CLKDR used as a gating signal, to measure a timing at which read data that is the same as write data is taken in.

It should be noted that in the configuration shown in FIG. 16, it is assumed that flip-flops F0 to Fn included in scan register circuit 30 and read data bits Q0 to Qn of memory 3 are the same in the number of bits. However, the number of flip-flops included in scan register circuit 30 has only to be equal, at minimum, to the number of read data bits Q0 to Qn of memory 3, but may be more than the number of data bits Q0 to Qn read out from memory 3. Since scan register circuit 30 constitutes a scan path, by sequentially transferring a taken in signal, read data from memory 3 can be individually identified by an external tester on a bit basis.

FIG. 18 is a diagram illustrating a manner of measuring a phase difference between memory clock signal MCLK and transfer clock signal CLKDR. In order to measure a phase difference according to the manner shown in FIG. 18, phase comparison circuit 20 shown in FIG. 10 is used. In the configuration shown in FIG. 10, flip-flop 22 takes in memory clock signal MCLK in synchronization with gating signal CLKDR. Therefore, a rise of transfer clock signal CLKDR is shifted with a time of a rise of memory clock signal MCLK being a reference time Tref, to take in memory clock signal MCLK. Transfer clock signal CLKDR has a rise timing changed with a rise of memory clock signal MCLK being a reference in an external tester.

Therefore, if at time Tb, it is determined that memory clock signal MCLK rises at a rise timing of transfer clock signal CLKDR, an actual phase difference between memory clock signal MCLK and transfer clock signal CLKDR can be measured based on the shift in rise timing (Tb−Tref−tCLK) of memory clock signal MCLK.

By measuring an actual phase difference between memory clock signal MCLK and transfer clock signal CLKDR, access time tAC can be corrected based on a set value of an access time in a tester and an actual phase difference to measure a correct access time. That is, a measured access time is an access time set in a tester and by correcting the measured access time with an actual phase difference between the memory clock signal and the transfer clock signal (gating signal), an influence of an interconnection delay and other(s) can be compensated for to determine a correct access time.

As described above, according to the fifth embodiment of the present invention, data read out from memory 3 is taken into a serial scan path to sequentially transfer, thereby achieving correct measurement on an access time of a memory. Furthermore, a scan path register circuit for transferring data indicating validation/invalidation of an input node of a memory is used as a scan path transferring data read out from the memory. Therefore, there is no necessity to provide a path for measuring setup/hold times and a path for measuring an access time both separately, thereby, achieving reduction in occupancy area of a test circuit.

Moreover, by detecting a phase difference between a memory clock signal and a transfer clock signal (gating signal) to compensate for an access time, the access time can be measured with high precision.

Sixth Embodiment

FIG. 19 is a diagram schematically showing an overall configuration of a semiconductor integrated circuit device according to a sixth embodiment of the present invention. In FIG. 19, a JATG test circuit 45 is provided to logic circuit 2. JTAG test circuit 45 is a circuit for testing an internal state of logic circuit 2 using a boundary scan register, and is standardized in IEEE Std. 11149.1. JTAG test circuit 45 performs a test scheme proposed and standardized by the joint test action group JTAG. The JTAG test is a method that all external input/output terminals of a semiconductor device are scanned in serial sequence to perform input/output of data and to test an internal function of the semiconductor device and an assembled printed circuit board. A configuration of JTAG test circuit will be described later.

On the other hand, as a configuration for testing setup and hold times and an access time of memory 3, in invalid data generating circuit 6, a scan path 52 is formed with boundary scan registers BSR, which are generally used in the JTAG test. In scan path 52, valid/invalid data is serially transferred and latched. A modifying circuit 50 includes EXOR circuits provided corresponding to input ports of memory 3 and modifies a test signal applied from test circuit 5 according to valid/invalid data stored in scan path 52 to apply the modified test signal/data to memory 3 through select circuit 7.

Read data from memory 3 is transferred to scan path 52 as well.

A configuration and operation control of a boundary scan register (BSR) is standardized in a JTAG test standard and by forming scan path 52 transferring valid/invalid data VD according to the standardized standard, easy control is ensured. Furthermore, boundary scan registers included in JTAG test circuit 45 can be partly used for a memory test, thereby achieving reduction in the number of components of a circuit dedicated to measurement on setup and hold times and an access time, resulting in decrease in occupancy area.

Figure 20:
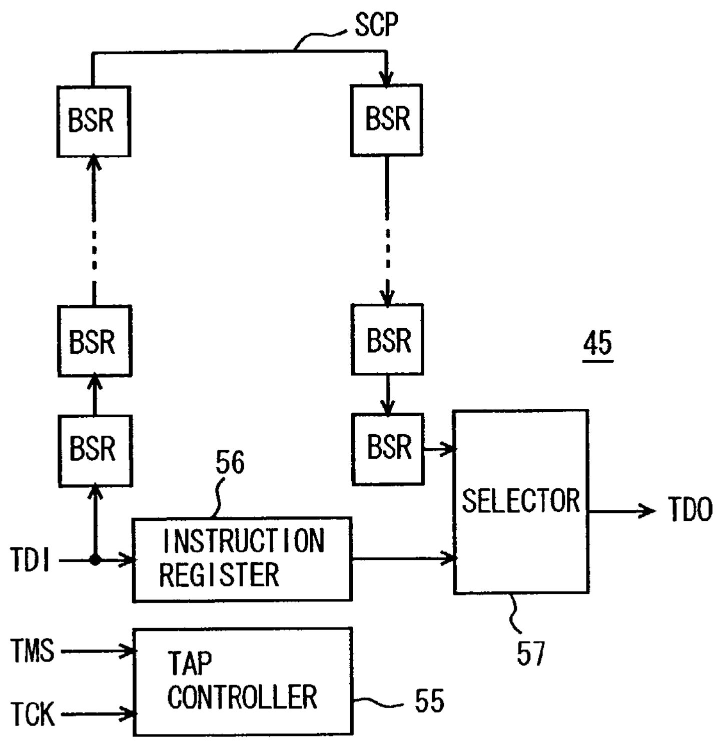
FIG. 20 is a diagram schematically showing a configuration of a JTAG test circuit shown in FIG. 19.

FIG. 20 is a diagram schematically showing a configuration of JTAG test circuit 45 shown in FIG. 19. In FIG. 20, JTAG test circuit 45 includes: a TAP controller 55 for generating a signal controlling contents of a test operation according to test mode select signal TMS and test clock signal TCK applied externally; an instruction register 56 receiving and decoding a test data input signal TDI applied externally as an instruction; boundary scan registers BSR constituting a serial scan path SCP for transferring test data input signal TDI serially; and a selector 57 selecting one of an output signal of boundary scan register BSR at the last stage of scan path SCP and an output signal of instruction register 56 for outputting as a test data output signal TDO.

Usually, in JTAG test circuit 45, there are provided: a bypass register for bypassing scan path SCP; and an option register whose use can be specified by a user. However, in FIG. 20, they are not shown for simplification of the figure.

A section including terminals for inputting test data input signal TDI, test mode select signal TMS, test clock TCK and for outputting test data output signal TDO is usually called a test access port (TAP), and is standardized and provided in a semiconductor integrated circuit device conforming to the JTAG test.

Boundary scan registers BSR constituting scan path SCP are provided corresponding to input nodes and output nodes of an internal circuit (logic circuit 2), respectively. By transferring test data input signal TDI through boundary scan registers BSR constituting a serial scan path, operations of semiconductor integrated circuit devices can be individually verified even at a board assembly level.

TAP controller 55 is a state machine whose state is updated according to test mode select signal TMS and controls operations such as capturing (taking in), transfer and updating of test data.

Instruction register 56 has a decoding function, and reads in and decodes instruction bits for TAP controller 55, to cause an internal circuit to perform a desired function.

JTAG test circuit 45 has a normal mode and a test mode. In the normal mode, an internal circuit (logic circuit) is coupled to external terminals (pads) to perform a normal mode operation according to an external signal and input/output signals of the logic circuit in the normal mode operation can be taken into boundary scan registers BSR of scan path SCP. By transferring a signal taken in or captured in boundary scan registers BSR through a serial scan path, an operating state of the internal circuit (logic circuit) can be monitored externally.

Serial transfer of test data is performed in the test mode. In this mode, the internal circuit (logic circuit) is disconnected from the external pin terminals (pads). Test data is transferred to set the test data at each node of the internal circuit. The internal circuit is operated according to the test data to again take in or capture a result of operation into boundary scan registers to transfer the result to the outside.

Figure 21:
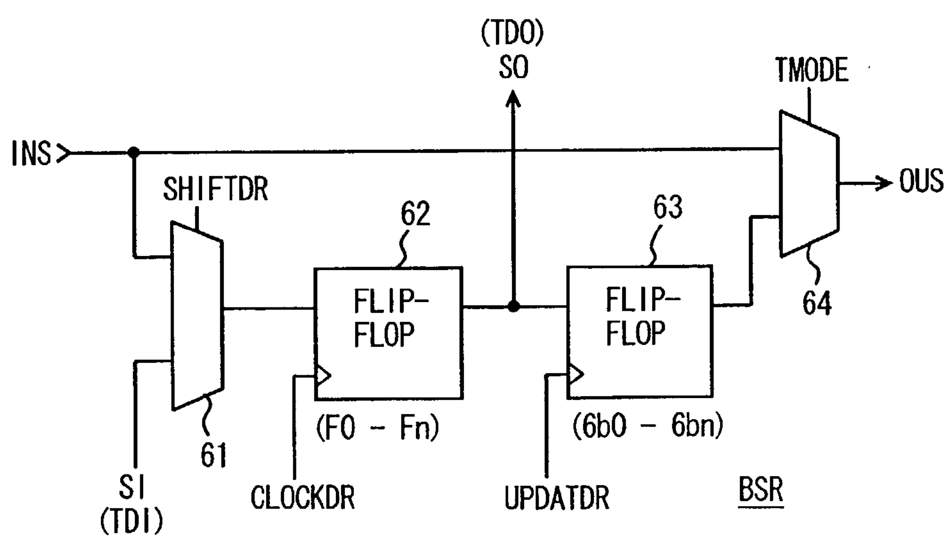
FIG. 21 is a diagram schematically showing a boundary scan register according to the sixth embodiment of the present invention.

FIG. 21 is a diagram schematically showing an example configuration of boundary scan register BSR. In FIG. 21, boundary san register BSR includes: a multiplexer 61 selecting one of normal input signal INS and serially transferred test data SI (TDI) according to select signal SHIFTDR; a flip flop 62 latching a signal selected by multiplexer 61 according to a shift clock signal CLOCKDR; a flip-flop 63 for taking in and latching an output signal of flip-flop 62 according to update clock signal UPDATDR; and a multiplexer 64 selecting one of input signal INS and a latch signal of flip-flop 63 according to test mode select signal TMODE.

In a case of an input cell where boundary scan register BSR is provided corresponding to an input pad and a signal applied externally is transmitted to an internal circuit, input signal INS applied externally is transferred to the internal circuit (logic circuit) as an internal signal OUS in the normal operation mode.

On the other hand, in a case of an output cell where boundary scan register BSR is provided corresponding to an output node, and input signal INS is a signal outputted from an internal circuit (logic circuit) and signal OUS is a signal transmitted to a pad in the normal operation mode.

Test mode select signal TMODE is a signal specified according to an instruction stored in instruction register 56 or to test mode select signal TMS, and set under control of TAP controller 55. In the normal operation mode, multiplexer 64 selects signal INS to generate output signal OUS. On the other hand, multiplexer 64 selects an output signal of flip-flop 63 to disconnect an internal circuit from an external terminal (pad).

Select signal SHIFTDR is a shift clock signal and when select signal SHIFTDR is activated, serial input signal SI is selected and transferred to boundary scan register BSR at the next stage through flip-flop 62. Hence, by activating select signal SHIFTDR to repeatedly toggle clock signal CLOCKDR, test input data TDI can be sequentially transferred through scan path SCP as serial input signal SI.

Update clock signal UPDATDR applied to flip-flop 63 is a signal for fixing a stored data (signal) in boundary scan register BSR. When update clock signal UPDATDR is activated, a state is implemented where data stored in flip-flop 62 of boundary scan register BSR is latched in flip-flop 63 and is output as output signal OUS through multiplexer 64.

Transfer clock signal CLOCKDR is a clock signal generated based on test clock signal TCK. Signal CLKDR for gating a signal in the previous embodiment corresponds to this transfer clock signal.

In the sixth embodiment, in boundary scan registers BSR connected in series of scan path 52, flip-flops 62 are used as flip-flops F0 to Fn constituting scan register 30 for transferring valid/invalid data, while flip-flops 63 are used as register circuits 6*b*0 to 6*b*n for storing valid/invalid data VD.

According to a standard to which the JTAG test conforms, measurement on setup and hold times and an access time for memory 3 can be performed. Usually, transfer clock signal CLOCKDR is generated in synchronization with test clock signal TCK. Therefore, by separately generating clock signal MCLK applied to memory 3 and test clock signal TCK, memory clock signal MCLK and asynchronous control signal PTX can be taken in at a necessary timing to achieve not only detection of a phase difference between the signals but also detection of a phase difference between transfer clock signal CLOCKDR and memory clock signal MCLK.

Then, in boundary scan register BSR, three states can be set as basic states. One is a capture state, Capture, where signal INS applied to an internal node can be taken in. Another state is a shift state, Shift, where a scan path is formed through multiplexer 61 and flip-flop 62 (a boundary scan register constitutes a shift register) to transfer test data signal through a serial scan path according to transfer clock signal CLOCKDR.

The third state is an update state, Update. In the Update state, an output signal of flip-flop 62 is fixedly held by flip-flop 63. Content latched by flip-flop 63 in the update state appears at an output of boundary scan register BSR. With the update state, an internal node can be set to a state corresponding to a test signal in the JTAG test.

Therefore, in boundary scan register BSR, flip-flop 62 constitutes a shift register for transferring data/signal serially, while flip-flop 63 constitutes a latch circuit for latching data. By using flip-flops 63 as register circuits 6*b*0 to 6*b*n for latching valid/invalid data, and using flip-flops 62 as scan registers F0–Fn for transferring valid/invalid data, transfer of valid/invalid data can be performed with a simple configuration.

Specifically, by setting boundary scan registers BSR to the shift state according to the JTAG test standard to transfer valid/invalid data and then setting boundary scan registers BSR to the update state, the valid/invalid data can be stored into boundary scan registers BSR. Control of transfer and latch of data in scan path 52 are standardized according to the JTAG test and a configuration according to the JTAG test standard can be employed as a control configuration, thereby improving design efficiency of an invalid data generating circuit.

Modification

FIG. 22 is a diagram schematically showing a modification of a configuration according to the sixth embodiment of the present invention. In the configuration of FIG. 22, scan circuits 70*a* to 70*d* constituting a serial signal/data transfer path are provided to logic circuit 2. In FIG. 22, there is shown a configuration in which scan circuits 70*a* to 70*d* are arranged surrounding logic circuit 2. Scan circuits 70*a* to 70*d* are only required to contain boundary registers provided corresponding to input/output nodes (pads) of logic circuit 2, and is not particularly required to be arranged surrounding logic circuit 2. Here, in order to show that a scan path is formed for logic circuit 2 and further the scan path is used for a test on a memory, scan circuits 70*a* to 70*d* are shown surrounding logic circuit 2.

Test input data TDI and test output data TDO are inputted/outputted through test access port TAP. Furthermore, a TAP controller 55 is provided to scan circuits 70*a* to 70*d*, and test mode select signal TMS and test clock signal TCK are applied to TAP controller 55 from test access port TAP.

In the configuration shown in FIG. 22, logic circuit 2 communicate signal/data with memory 3 through scan circuit 70*b* in a scan path constituting a serial transfer path for test data to logic circuit 2. That is, scan circuit 70*b* includes an input cell and an output cell provided to an input/output node to memory 3 of logic 2. A signal and write data are applied to select circuit 7 from logic 2 through scan circuit 70*b*. Modified data from modifying circuit 50 is applied to select circuit 7. In order to indicate validation/invalidation of data of modifying circuit 50, scan circuit 70*c* is used as a circuit for shifting and setting valid/invalid data.

In the configuration shown in FIG. 22, read data from memory 3 is further taken in by scan circuits 70*b* and 70*c* and then output externally through scan circuit 70*d*.

Therefore, in the configuration shown in FIG, 22, setting of valid/invalid data to a signal/data for memory 3 as well as take in of data read out from memory 3 can be performed using TAP controller 55.

Moreover, in the normal operation mode, if select circuit 7 is set to a state of selecting an output signal of logic circuit 2, read data from memory 3 bypasses select circuit 7 and is transmitted to scan circuits 70*b* and 70*c*. It can be determined whether or not write and read of data is performed according to an instruction/control signal from logic circuit 2, and the connection between logic circuit 2 and memory 3 can be tested using a so-called boundary scan test.

It should be noted that in the configuration shown in FIG. 22, valid/invalid data are shown being set by scan circuit 70*c*. However, since a bit width of write data to memory 3 and a bit width of read data from memory 3 are the same as each other, valid/invalid data VD for modifying circuit 50 may be set using a part or the whole of scan circuit 70*b*.

As described above, according to the sixth embodiment of the present invention, circuitry for transferring and latching data determining validation/invalidation are constituted using a boundary scan register circuit in conformity to the IEEE standard similar to the JTAG test circuit, thereby achieving reduction in circuit occupancy area. In addition, a connection test between a logic and a memory can be performed according to boundary scan test.

Seventh Embodiment

Figure 23:
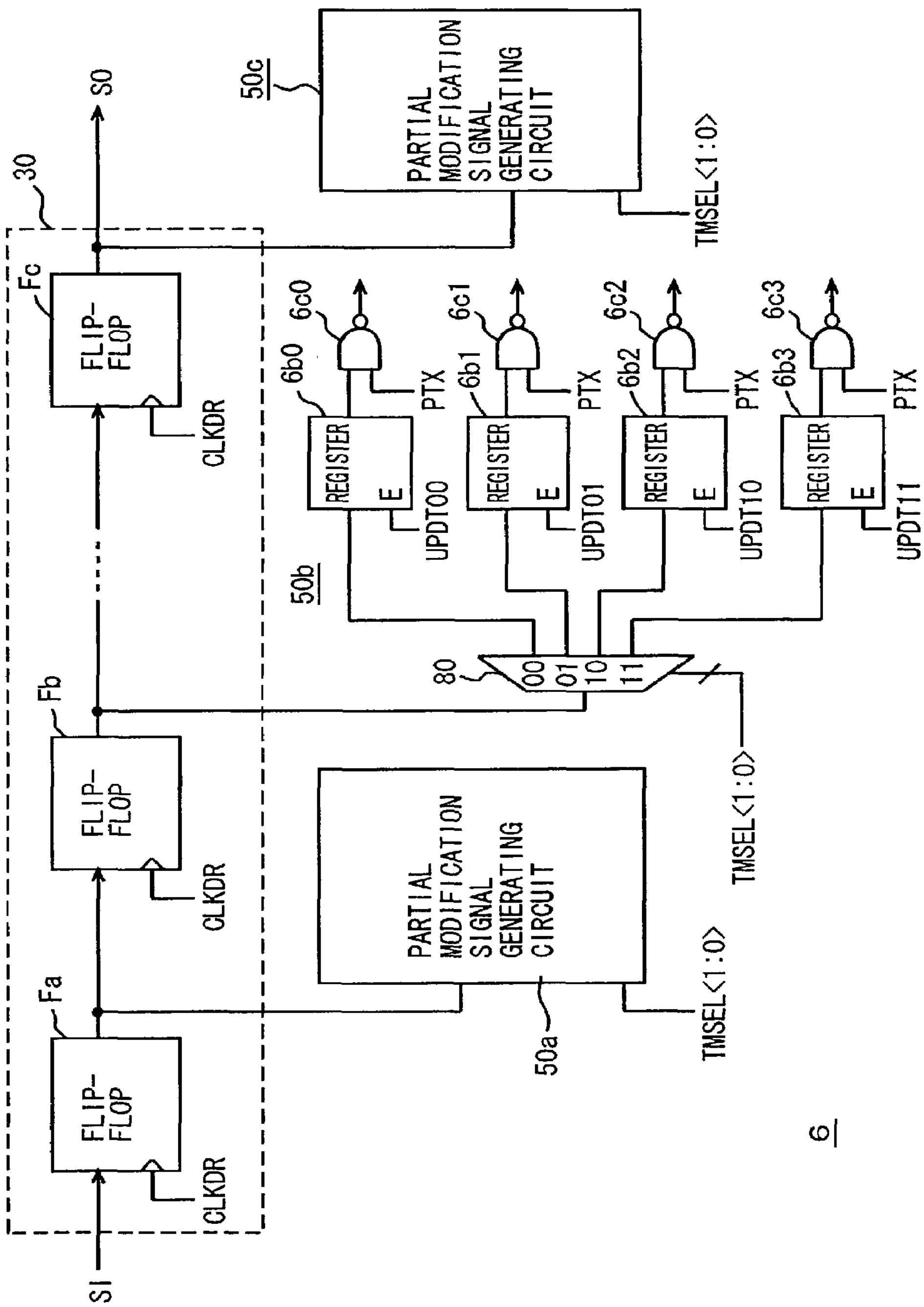
FIG. 23 is a diagram schematically showing a configuration of a main portion of a semiconductor integrated circuit device according to a seventh embodiment of the present invention.

FIG. 23 is a diagram schematically showing a configuration of a main portion of a semiconductor memory device according to a seventh embodiment of the present invention. In the configuration shown in FIG. 23, there are provided flip-flops Fa to Fc constituting a shift register for transferring a signal/data serially in scan register circuit 30.

A partial modification signal generating circuits 50*a* to 50*c* are provided corresponding to respective flip-flops Fa to Fc. Partial modification signal generating circuits 50*a* to 50*c* each include a plurality of registers for storing valid/invalid data. In FIG. 23, there is representatively shown a configuration of partial modification signal generation circuit 50*b*.

In FIG. 23, 4 registers 6*b*0 to 6*b*3 of partial modification signal generating circuit 50*b* store valid/invalid data setting validation/invalidation of a signal for respective input nodes of the memory.

Update clock signals UPDT00 to UPDT11 are applied to respective registers 6*b*0 to 6*b*3. Select circuit 80 is provided commonly to registers 6*b*0 to 6*b*3. Select circuit 80 transfers an output signal of a corresponding flip-flop Fb to one of 4 registers 6*b*o to 6*b*3 according to 2 bit register select signal TMSEL <1:0> applied from an external test apparatus. Registers 6*b*0 to 6*b*3 take in and latch signals applied in activation of update clock signals UPDT00 to UPDT11. Therefore, update clock signals UPDT00 to UPDT11 are activated according to select signal TMSEL <1:0>. That is, for registers 6*b*o to 6*b*3, update clock signals UPDT00 to UPDT11 are activated for a register selected by select circuit 80.

NAND circuits 6*c*0 to 6*c*3 receiving asynchronous control signal PTX at first inputs thereof are provided corresponding to respective registers 6*b*0 to 6*b*3. NAND circuits 6*c*0 to 6*c*3 receive outputs of respective registers 6*b*0 to 6*b*3 at their second inputs. Output signals of NAND circuits 6*c*0 to 6*c*3 are applied to EXOR circuits 6*f* receiving an output signal of the test circuit.

In the configuration shown in FIG. 23, there are provided registers 6*b*0 to 6*b*3 storing a plurality of valid/invalid data corresponding to each flip-flop transferring data serially in scan register 30. Therefore, the number of flip-flops performing serial transfer of a signal/data of scan register circuit 30 can be reduced to thereby decrease a circuit occupancy area.

In the configuration shown in FIG. 23, when select circuit 80 performs a selection operation, corresponding registers 6*b*0 to 6*b*3 latch data applied to themselves, respectively. Therefore, signals obtained by an operation of a logical product on update clock signals UPDT00 to UPDT11 and respective register select signal bits TMSEL <1:0> are applied to registers 6*b*0 to 6*b*3, respectively and only a selected register takes in a received signal according to a corresponding update clock signal, UPDT00 to UPDT11.

Moreover, san register circuit 30 may also be constituted using boundary scan registers BSR. A dedicated register circuit different from boundary scan register BSR is used for registers 6*b*0 to 6*b*3. Furthermore, the number of registers provided corresponding to one flip-flop F is not limited to 4, but may be any other number.

As described above, according to the seventh embodiment, in a scan register circuit for transferring valid/invalid data, a plurality of registers each for storing valid/invalid data are provided to one shift register (flip-flop). The number of shift registers for transferring valid/invalid data can be reduced and further area penalty can be reduced.

Eighth Embodiment

FIG. 24 is a diagram schematically showing a configuration of a test interface circuit according to an eighth embodiment of the present invention. The test interface circuit (TIC) generates data of 256 bits for memory 3 from one bit test data TDI to apply the data of 256 bits to memory 3. In generation of write data of 256 bits, one bit data is modified according to data applied through serial input SI to generate write data of a desired pattern.

Moreover, data MDO of 256 bits read out from memory 3 is converted into test output data TDO in 8 bit units to be sequentially output in synchronization with a test clock signal.

In an embedded memory, in order to directly access the memory externally with a small number of terminals, there is a case where a test interface circuit as described above is provided. In the eighth embodiment, the test interface circuit is used to measure setup and hold times of a signal/data.

In FIG. 24, the test interface circuit includes: a signal test circuit 102 for transferring a test address signal TADD and a test command TCMD applied from signal switch circuit 4 through internal bus 90 according to test clock signal TCLK; an invalidating signal generating circuit 104 for changing valid periods of test address signal TADD and test command TCMD applied from signal test circuit 102 according to asynchronous control signal PTX for output; a data test circuit 106 for transferring one bit test data applied from signal switch circuit 4 through internal bus 90 according to test clock signal TCLK; and an invalid data generating circuit 108 for generating test data of 256 bits from one bit test data TDI received from data test circuit 106 and selectively setting a valid period of the test data of 256 bits in units of bits according to asynchronous control signal PTX.

Invalid data generating circuit 108 includes: a shift register circuit for expanding one bit test data TDI to test data of 256 bits; and a gate circuit for setting a data pattern of 256 bits according to data stored in the shift register circuit.

An output signal of invalidating signal generating circuit 104 is applied to multiplexer 7*a*, while an output signal of invalid data generating circuit 108 is applied to multiplexer 7*b*. The multiplexers 7*a* and 7*b* select either of a logic address signal LADD and a logic command LCMD applied from logic circuit 2 and output signals/data of invalidating signal generating circuit 104 and invalid data generating circuit 108 according to test mode instructing signal MTEST for application to memory 3.

Data MDO of 256 bits read out from memory 3 is transferred to an external tester in 8 bit units according to test clock signal TCLK from a test output circuit 110 through signal switch circuit 4. Data MDO read out from memory 3 is also applied to logic circuit 2 without passing through a multiplexer in order to reduce a propagation delay when data is read in the normal operation mode. However, a transfer path of data MDO from memory 3 to logic circuit 2 is not shown for the simplicity of the figure.

Furthermore, such a configuration may be employed, in which a test command applied externally is applied in combination of logic levels at an edge of a clock signal of a plurality of control signals to be decoded in the test interface circuit and an operating mode instructing signal produced through decoding is applied to memory 3. In addition, a decoded operating mode instructing signal may be directly applied as test command TCMD. In this configuration, one of a plurality of operating mode instructing signals is activated.

In the test interface circuit shown in FIG. 24, invalidating signal generating circuit 104 is also provided for test address signal TADD and test command TCMD, and setup and hold times can be changed for each bit of test address signal TADD and each control signal of test command TCMD. Therefore, when a failure occurs, which signal causes a setup/hold failure can be specified, and thereby a countermeasure for accommodating for the cause of the specified failure can be taken in revision of a mask or the like.

Figure 25:
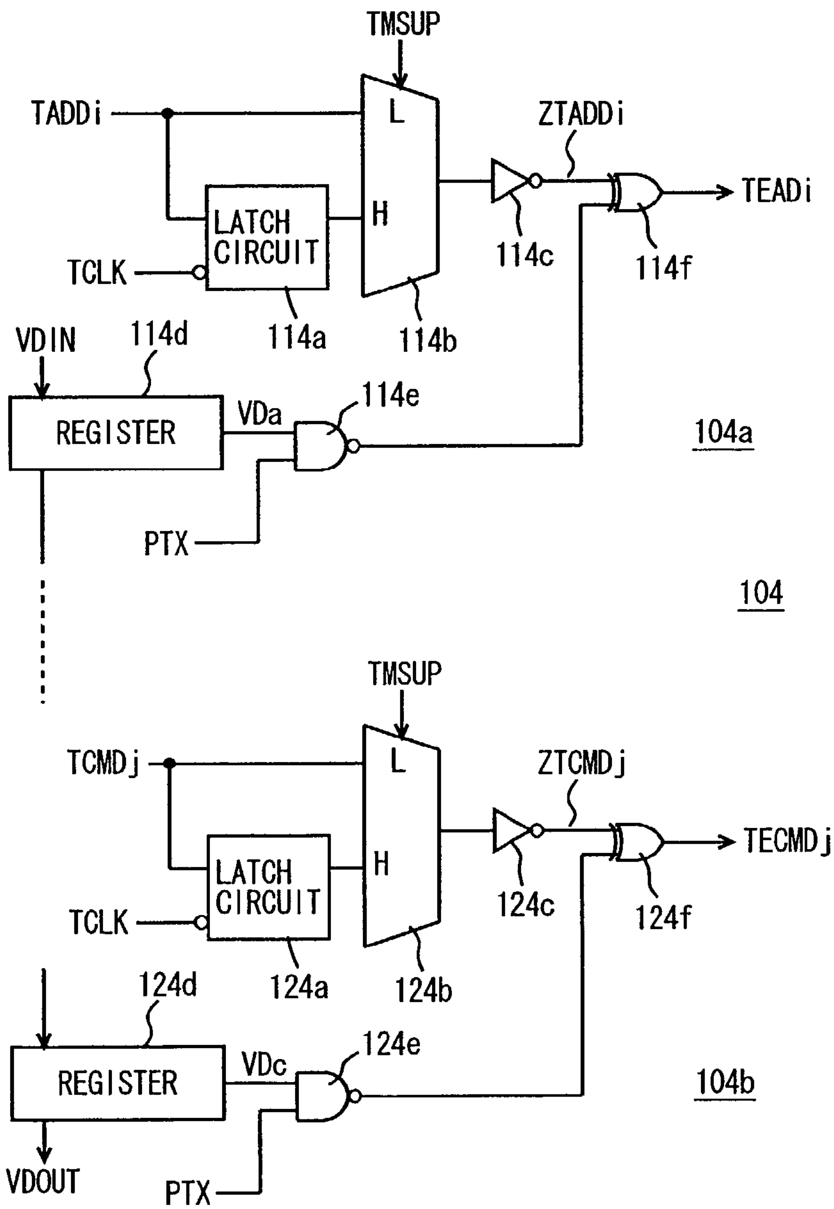
FIG. 25 is a diagram showing an example of a configuration of an invalidating signal generating circuit shown in FIG. 24.

FIG. 25 is a diagram schematically showing a configuration of invalidating signal generating circuit 104 shown in FIG. 24. Signal test circuit 102 and data test circuit 106 each are of the configuration similar to that shown in FIG. 3.

In FIG. 25, invalidating signal generating circuit 104 includes: a test address invalidating circuit 104*a* provided for test address signal TADD; and a test command invalidating circuit 104*b* provided for test command TCMD. In FIG. 25, there are representatively shown a configuration of a test address invalidating circuit provided for one bit test address signal TADDi and a configuration of a test command invalidating circuit provided for bit command signal TCMDj included in a test command signal TCMD.

Test address invalidating circuit 104*a* includes: a latch circuit 114*a* delaying test address signal bit TADDi by a half clock cycle according to test clock signal TCLK for transmission; a multiplexer 114*b* selecting one of test address signal TADDi transferred from a signal test circuit 102 and a latch signal outputted by latch circuit 114*a* according to test setup instructing signal TMSUP; and inverter 114*c* inverting an output signal of multiplexer 114*b*; a register 114*d* storing data VDa for invalidating/validating /validating test address signal bit TADDj; a NAND circuit 114*e* receiving asynchronous control signal PTX and data VDa stored in register 114*d*; and an EXOR circuit 114*f* *a*receiving output signal ZTADDi of inverter 114*c* and an output signal of NAND circuit 114*e* to generate test address signal bit TEADi to be transferred to the memory.

Test command invalidating circuit 104*b* includes: a latch circuit delaying test command signal TCMDj by a half clock cycle according to test clock signal TCLK for transmission; a multiplexer 124*b* selecting one of test command signal TCMDj applied from signal test circuit 102 and a latch signal of latch circuit 124*a* according to test setup instructing signal TMSUP; an inverter 124*c* inverting an output signal of multiplexer 124*b*; a register 124*d* storing data VDc determining validation/invalidation of test command signal TCMDj; a NAND circuit 124*e* receiving data VDc stored in register 124*d* and asynchronous control signal PTX; and an EXOR circuit 124*f* receiving output signal ZTCMDj of inverter 124*c* and an output signal of NAND circuit 124*e* to generate test command signal TECMDj to be transmitted to a memory.

The configurations of test address invalidating circuit 104*a* and test command invalidating circuit 104*b* shown in FIG. 25 are each similar to that of invalid data generating circuit 6 shown in FIG. 4. Asynchronous control signal PTX is selectively validated according to data VDa and VDc set in registers 114*d* and 124*d*, and valid window widths (of test clock TCLK) of test address signal TADDi and test command signal TCMDj are changed according to valid asynchronous control signal PTX.

In the configuration shown in FIG. 25, register 114*d* provided for test address signal TADD and register 124*d* provided for test command TCMD constitute a serial scan path transmitting data VDIN in serial sequence. By sequentially transferring data VDIN transmitted serially to store corresponding data in the registers, valid/invalid control data is set to each signal. Registers 114*d* and 124*d* may constitute a shift register.

Figure 26:
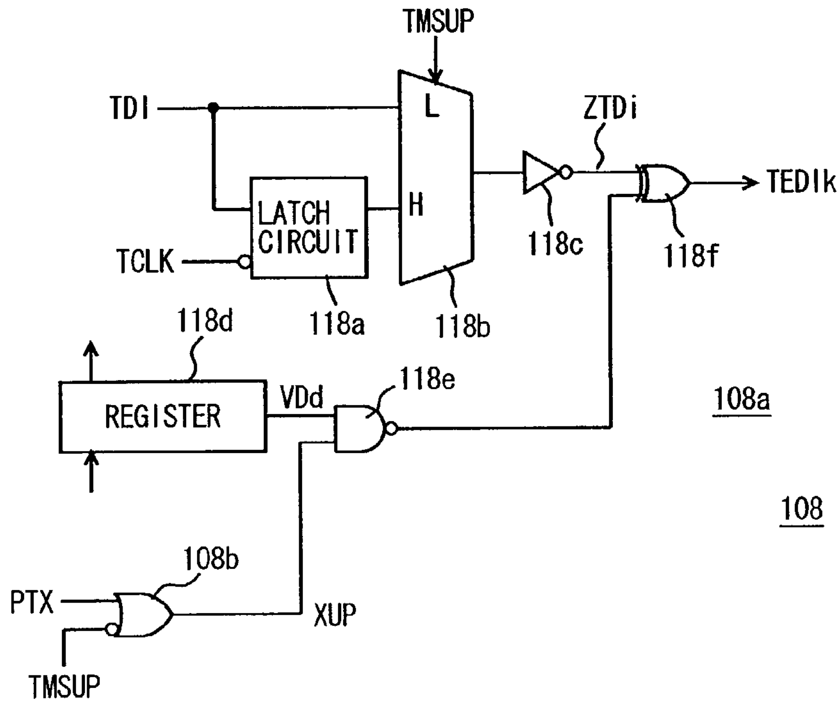
FIG. 26 is a diagram showing an example of a configuration of an invalid data generating circuit shown in FIG. 24.

FIG. 26 is a diagram schematically showing invalid data generating circuit 108 shown in FIG. 24. In FIG. 26, invalid data generating circuit 108 includes: a gate circuit 108*b* provided commonly to test data bits TEDI0 to TEDI255; and a data bit invalidating circuit 108*a* forming a corresponding test data bit TEDIk according to output signal XUP of gate circuit 108*b* and one bit test data TDI from data test circuit 106.

While data bit invalidating circuit 108*a* is provided corresponding to each of test data bits TEDI 0 to TESI 255, in FIG. 26 there is representatively shown test data invalidating circuit 108*a* provided for test data bit TEDIk.

Data bit invalidating circuit 108*a* includes: a latch circuit 118*a* delaying test data TDI by a half clock cycle according to test clock signal TCLK for transference; a multiplexer 118*b* selecting one of test data TDI and output data of latch circuit 118*a* according to test setup instructing signal TMSUP; an inverter 118*c* inverting output data of multiplexer 118*b*; a register 118*d* storing data setting validation/invalidation of a corresponding data bit TEDIk; a NAND circuit 118*e* receiving stored data VDd of register 118*d* and output signal XUP of gate circuit 108*b*; and an EXOR circuit 118*f* receiving output signal ZTDi of inverter 118*c* and an output signal of NAND circuit 118*e* to generate test data bit TEDIk.

Register 118*d* constitutes a shift register and data VDd setting validation/invalidation of the test data bit is sequentially transferred through a serial scan path constituted of the shift register for setting test data bits TEDI0 to TEDI255 in units of bits.

Gate circuit 108*b* fixes its output signal XUP at H level to fix a valid window width for a test data bit when test setup instructing signal TMSUP is at L level. When test setup instructing signal TMSUP is at H level, on the other hand, gate circuit 108*b* operates as a buffer circuit to change its output signal XUP according to asynchronous control signal PTX.

Specifically, when test setup instructing signal TMSUP is at L level, test data bit TEDI is modified according to data VDd stored in register 118*d* to generate test data bit TEDIk. Therefore, various data patterns can be generated in this mode.

When test setup instructing signal TMSUP is at H level, on the other hand, a valid window width of test data bit TEDIk is changed according to asynchronous control signal PTX. At this time, while a pattern of test data is fixed according to test data TDI, setup and hold times of each of test data bits TEDI0 to TEDI255 can be measured.

Figure 27:
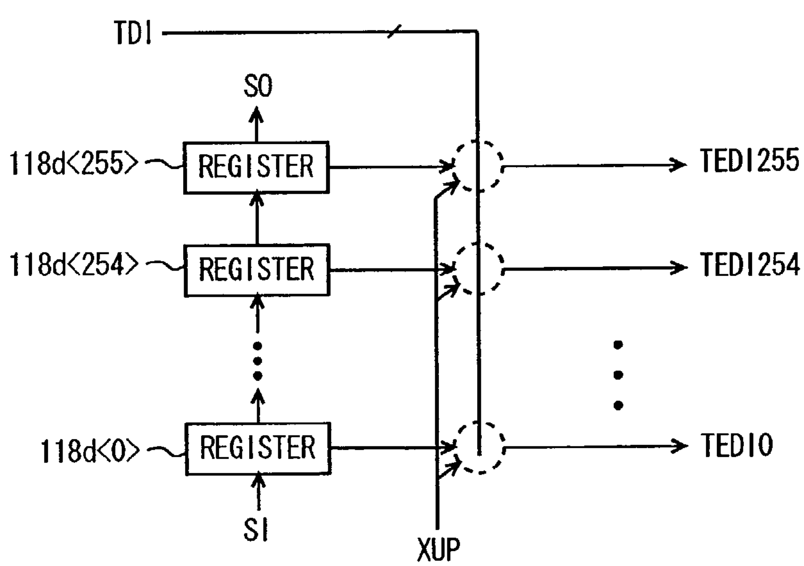
FIG. 27 is diagram schematically showing a correspondence of registers of the invalid data generating circuit shown in FIG. 24 to test data bits.

FIG. 27 is diagram illustrating a correspondence between test data bits outputted by invalid data generating circuit 108 and registers. In invalid data generating circuit 108, registers 118*d*<0> to 118*d*<255> are provided corresponding to data bits TEDI0 to TEDI255, respectively. Registers 118*d*<0> to 108*d*<255> constitute a shift register and sequentially transfer one bit serial input data SI to store data for setting a data pattern or data for changing a valid widow width.

Output signal XUP of gate circuit 108*b* is applied commonly to test data bits TEDI0 to TEDI255 to generate test data bits TEDI0 to TEDI255 according to one bit test data TDI and stored data of respective registers 118*d*<0> to 108*d*<255>. Now, description will be given of operation of the test interface circuit shown in FIGS. 24 to 27 with reference to a timing chart shown in FIG. 28.

Figure 28:
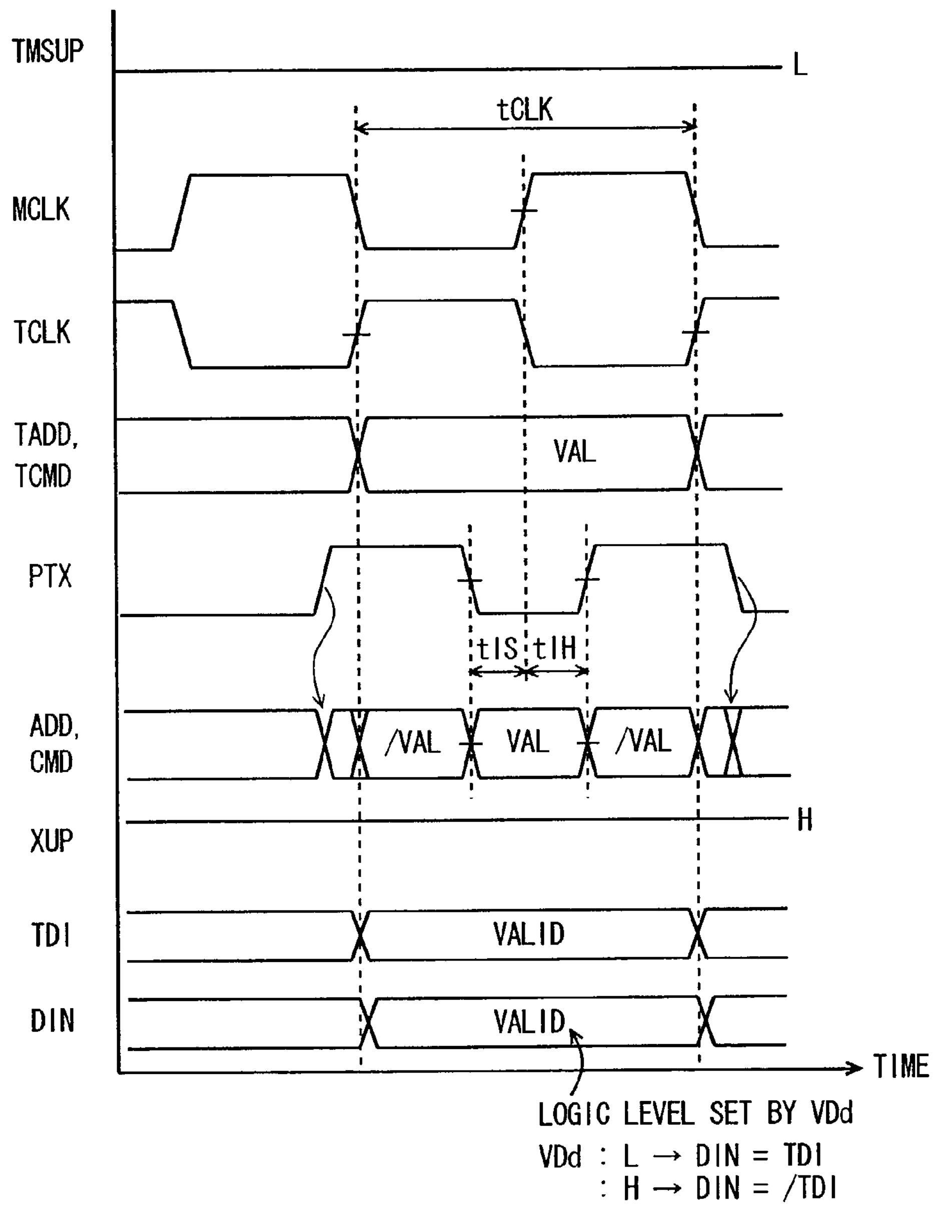
FIG. 28 is a timing chart representing an operation of the semiconductor integrated circuit device shown in FIG. 24.

In FIG. 28, test setup instructing signal TMSUP is set to L level. In this case, multiplexers 114*b* and 124*b* shown in FIG. 25 select test address TADD (address signal bit TADDi) and test command TCMD (command signal TCMDj), respectively. Memory clock signal MCLK is applied to memory 3. Test clock signal TCLK is a clock signal complementary to memory clock signal MCLK applied to memory 3. Memory clock signal MCLK is generated by a different path from that of test clock signal TCLK.

Signal test circuit 102 and data test circuit 106 shown in FIG. 24 transmit test address signal TADD and test command TCMD and test data TDI, respectively, according to test clock signal TCLK, and test address signal TADD and test command TCMD and test data TDI are changed in synchronization with a rise of test clock signal TCLK.

Asynchronous control signal PTX is set to H level prior to a rise of test clock signal TCLK. When asynchronous control signal PTX is at H level, NAND circuits 114*e* and 124*e* shown in FIG. 25 each operate as an inverter to invert data VDa and VDc stored in registers 114*d* and 124*d* for transmission to respective EXOR circuits 114*f* and 124*f*.

On the other hand, output signal XUP of gate circuit 108*b* is fixed at H level since test setup instructing signal TMSUP is at L level. NAND circuit 118*e* operates as an inverter to invert stored data VDd of register 118*d* and to transmit the inverted data to EXOR circuit 118*f*.

In a case when data at L level is stored in registers 114*d* and 124*d* in this state, output signals of NAND circuits 114*e* and 124*e* are driven to H level and EXOR circuits 114*f* and 124*f* operates as inverters. If data VDa and VDc stored in registers 114*d* and 124*d* are both at H level, when asynchronous control signal PTX is at H level, output signals of NAND circuits 114*e* and 124*e* attain L level, and EXOR circuits 114*f* and 124*f* operate as buffer circuits. Responsively, test address signal bit TEADi and test command signal TECMDj attain the inverted states of logic levels of transferred test address signal TADDi and test command signal TCMDj. In FIG. 28, this state is indicated with a symbol "/VAL".

When asynchronous control signal PTX falls to L level asynchronously to test clock signal TCLK, output signals of NAND circuits 114*e* and 124*e* shown in FIG. 25 are driven to H level, EXOR circuits 114*f* and 124*f* operates as inverter circuits, and test address signal bit TEADi and test command signal TECMDj to be transferred to the memory circuit are driven to the same logic levels as those of test address signal bit TADDi and test command signal TCMDj. In FIG. 28, the states of test address signal TADD and test command TCMD to be transferred are shown with a symbol "VAL".

Test address signal bit TEADi and test command signal TECMDj are transferred to memory 3 through multiplexer 7*a* shown in FIG. 24. As to address signal ADD and command CMD in a test mode, logic levels of a test address signal bit and a test command signal bit change in response to a transition of asynchronous control signal PTX when corresponding data VDa and VDc are both at L level. Valid periods of address signal ADD and command CMD are determined by a period when asynchronous control signal PTX is at L level, similarly to the first embodiment.

When asynchronous control signal PTX is again driven to H level, test address signal bit TEADi and test command signal TECMDj attain a state of logical inversion (/VAL) if data VDa and VDc stored in corresponding registers 114*d* and 124*d* are both at H level.

On the other hand, for test data TEDI, since NAND circuit 118*e* outputs a signal at H level regardless of a change of asynchronous control signal PTX, test data TDI attains a logic level modified by data VDd stored in register 118*d*.

Specifically, when data VDd stored in register 118*d* is at L level, output signal of NAND circuit 118*e* is driven to H level, EXOR circuit 118*f* operates as an inverter, and test data TDI and test data bit TEDIk applied to memory 3 attain the same level. When data VDd is at H level, the output signal of NAND circuit 118*e* is driven to L level, EXOR circuit 118*f* operates as a buffer circuit and test data TEDIk attains the same logic level as that of output bit ZTDi of inverter 118*c*, or a logic inverted state of test data TDI.

Therefore, when test setup instructing signal TMSUP is set to L level, as for data, test data TDI is modified according to data stored in register 118*d*(118*d*<255:0>) to generate a test data pattern, while as for test address signal TADD and test command signal TCMD, setup and hold times tIS and tIH relative to a falling edge of test clock signal TCLK, or to a rise of memory clock signal MCLK applied to memory 3, are set according to asynchronous signal PTX.

In this state, data is written into and read out from memory 3. A functional test on whether or not data is normally written and then read out is performed based on coincidence/non-coincidence in logic level between write data and read data, and determination is made on the presence or absence of a failure. Detection of a setup/hold failure is performed in a manner similar to that in the first embodiment.

Read of test data is achieved by reading out read data MDO of 256 bits from memory 3 in 8-bit units, using test output circuit 110 shown in FIG. 24. A configuration for data read is not limited to such scheme, but an I/O address signal for 1/32 selection may be applied externally to perform 1/32 selection for each test output terminal. In this configuration, data of 32 bits is allocated to one test data output terminal and selection of one bit data from 32 bit data is performed for each terminal according to the I/O address signal.

Therefore, when test setup instructing signal TMSUP is at L level, as for each signal/bit of test address signal TADD and test command TCMD, the execution and non-execution of measurement on setup and hold times tIS and tIH can be individually set according to data VDa and VDc stored in registers 114*d* and 124*d*, for identifying a setup/hold failure individually.

Figure 29:
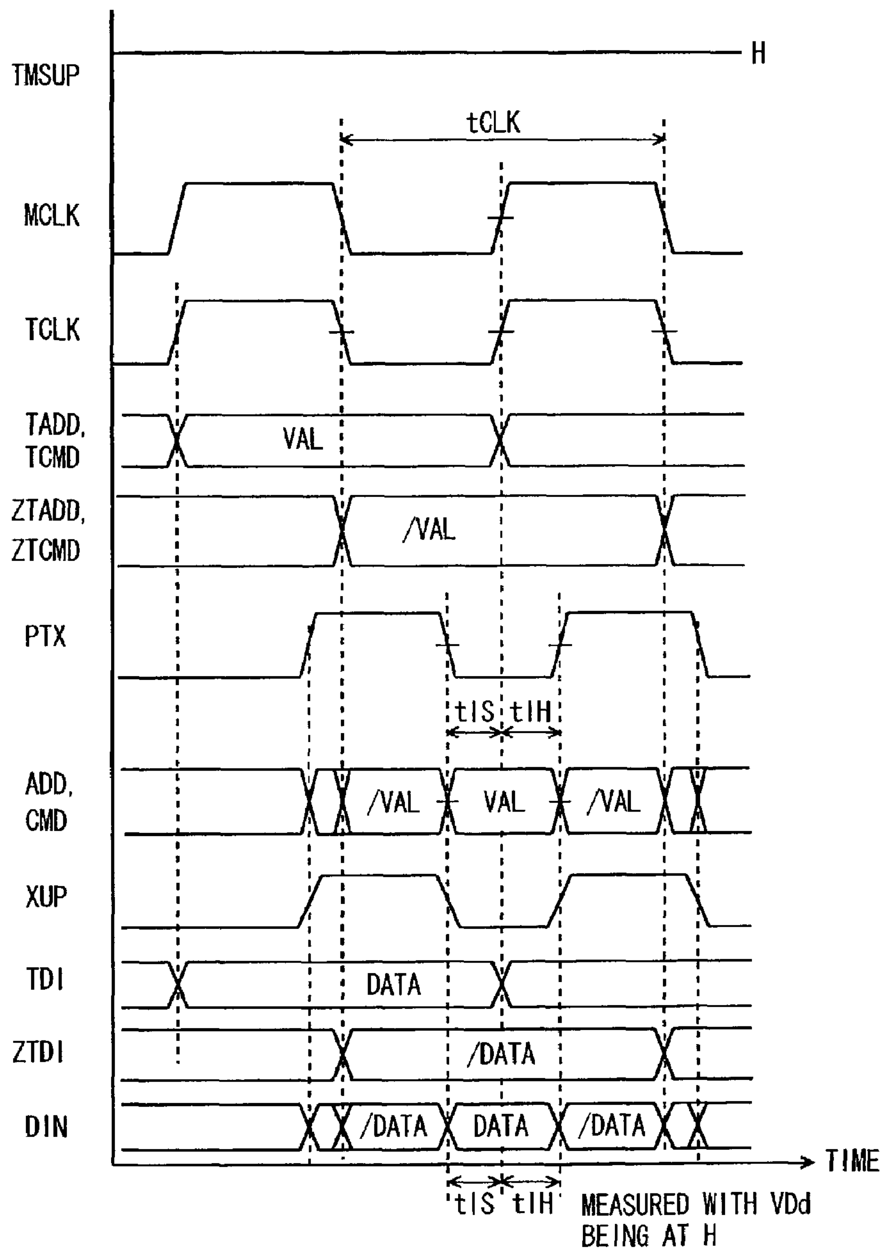
FIG. 29 is a timing chart represent an operation of the semiconductor integrated circuit device shown in FIG. 24.

Then, description will be given of operation in a case when test setup instruction signal TMSUP is at H level with reference to a timing chart shown in FIG. 29.

In this mode, memory clock signal MCLK and test clock signal TCLK are clock signals in phase. In this case, it is assumed that as shown in FIG. 28, if memory clock signal MCLK and test clock signal TCLK are applied through different paths, memory clock signal MCLK and test clock signal TCLK are adjusted into in-phase clock signals externally.

In a test, there is a case where only test clock signal TCLK is available and test clock signal TCLK is applied to memory 3 as memory clock signal MCLK. This scheme corresponds to a state shown in FIG. 7 or 8.

When test setup instructing signal TMSUP is set to H level, multiplexers 114*b* and 124*b* shown in FIG. 25 and multiplexer 118*b* shown in FIG. 26 select output signals of latch circuits 114*a*, 124*a* and 118*a*, respectively. Latch circuit 114*a* is in a latch state when test clock signal TCLK is at H level, and enters a through state when test clock signal TCLK is driven to L level.

Therefore, test address signal TADD, test command TCMD and test data TDI changes according to test clock signal TCLK, output signals of latch circuits 114*a*, 124*a* and 118*a* change in synchronization with a fall of test clock signal TCLK, and complementary test address signal ZTADD and complementary test command ZTCMD, and complementary test data ZTDI attain definite states of /VAL, and a definite state of /DATA, respectively.

Since test setup instructing signal TMSUP is at H level, output signal XUP of gate circuit 108*b* shown in FIG. 26 changes according to asynchronous control signal PTX. Therefore, in a case when data VDa, VDc and VDd stored in registers 114*d*, 124*d* and 118*d* are set to H level, EXOR circuits 114*f a*, 124*f* and 118*f* receive signals at L level from NAND circuits 114*e*, 124*e* and 118*e* to operate as buffers when asynchronous control signal PXT is at H level. Therefore, in this state, address signal ADD, command CMD and write data DIN applied to memory 3 attain the logical inversion states of /VAL and /DATA.

If asynchronous control signal PTX falls to L level when data VDa, VDc and VDd are all at H level, NAND circuits 114*e*, 124*e* and 118*e* output the signals at H level, EXOR circuits 114*f a*, 124*f* and 118*f* operate as inverters, and address signal ADD, command CMD and write data DIN applied to memory 3 attain the same logic levels as those of test command TCMD, test address signal TADD and test data TDI.

If asynchronous control signal PTX is raised again to H level when data Vda, VDc and VDd are all at H level, address signal ADD, command CMD and write data Din applied to memory 3 attain the logical inversion states of transferred test address signal TADD, test command TCMD and test data TDI.

By changing a fall time point and a rise time point of asynchronous control signal PTX relative to a rise time point of test clock signal TCLK, setup and hold times tIS and tIH of each signal of test command, each bit of test address signal TADD and each bit of input data DIN can be changed.

In this state, by determining whether or not write/read of data is correctly performed on memory 3, a setup/hold failure of data and a setup/hold failure of a command and an address can be individually identified.

When data VDa, VDc and VDd are all set at L level, output signals of NAND circuits 114*e*, 124*e* and 118*e* are at H level regardless of a logic level of asynchronous control signal PTX. In this state, signal bits at the same logic levels as the logic levels of bits of test address signal TADD, test command TCMD and test data TDI are transferred to memory 3 in synchronization with a fall of test clock signal TCLK.

In a case where setup and hold times of input data DIN are to be measured, data stored in register 118*d* is used as data indicating whether or not the input data DIN is an object for the measurement. At this time, as a test data, 256 bit data at the same logic levels as that of data at a single logic level, or one bit test data TDI is applied to memory 3.

Therefore, in this mode, setup and hold times can be detected for each of an address signal, a command and data (which are individually determined by data stored in a register). Therefore, in a case where a setup/hold margin is inadequate, the degree of shortage of the margin can be identified by measuring the setup and hold times of only the signal/bit of interest. Therefore, a measure for improving a setup/hold margin through revision of a mask or the like can be obtained.

As test command TCMD, a decoded operating mode instructing signal may be used as described above. That is, the following operating mode instructing signals may be prepared for test command TCMD and one of them may be activated in accordance with an operation mode to be performed: a row active instructing signal RACT instructing a row select operation, a precharge instructing signal PRC instructing a precharge operation in the memory, a column active signal CACT instructing a column selection operation, a read instructing signal READ instructing data read, and a write operation instructing signal WRITE instructing a write operation.

Furthermore, alternatively, a configuration may be employed in which an operation mode is specified by logic levels, at a rising edge of memory clock signal MCLK, of a row address strobe signal /RAS, a column address strobe signal /CAS and a write enable signal WE.

In addition, register 118*d* for test data, register 114*e* for a test address signal bit and register 124*d* for a test command may be configured to constitute a shift register for transferring data from serial input SIN serially to set desired data in the respective registers. Moreover, registers for a test address signal and a test command may be constituted of boundary registers BSR as described above.

As described above, according to the eighth embodiment of the present invention, data setting a valid/invalid state of asynchronous control signal PTX is transferred serially to be stored in registers and in addition, a valid/invalid state of asynchronous control signal PTX for data is selectively set according to test setup instructing signal. Thus, individual identification of setup/hold failure of a command signal, an address signal and data can be achieved. Moreover, only one bit test input data and 8 bit test output data are inputted/outputted, and reduction in the number of pin terminals used in a test can be achieved and therefore, scale of a signal switch circuit can be reduced.

Ninth Embodiment

FIG. 30 is a diagram schematically showing a configuration of a main portion of a semiconductor integrated circuit device according to a ninth embodiment of the present invention. In FIG. 30, there is shown a configuration of a section including invalidating signal generating circuit 104 and invalid data generating circuit 108 in a test interface circuit.

In FIG. 30, invalidating signal generating circuit 104 includes: an invalid address signal generating circuit 150 for selectively invalidating address signal bits; and an invalid command signal generating circuit 152 for selectively invalidating a command signal.

Invalid address signal generating circuit 150 includes: an address bit invalidating circuit 104*a* provided corresponding to each of test address signal bits TEAD0 to TEADn. A configuration itself of address bit invalidating circuit 104*a* is of the same configuration as that shown in FIG. 25.

Invalid command signal generating circuit 152 includes: command signal invalidating circuits 104*b* provided corresponding to respective test command signals TECMD0 to TECMDm. A configuration itself of command signal invalidating circuit 104*b* is also the same as of the command invalidating circuit shown in FIG. 25.

For invalid signal generating circuit 104, there is provided a mode switch circuit 160 for generating invalidation control signal ACXUP according to asynchronous control signal PTX and test setup instructing signal TMSUP.

Mode switch circuit 160 includes an AND circuit (a negative logic OR circuit) 160*a* receiving asynchronous control signal PTX and test setup instructing signal TMSUP to generate invalidation control signal ACXUP. Invalidation control signal ACXUP is applied commonly to address bit invalidating circuit 104*a* and command signal invalidating circuit 104*b*.

Invalid data generating circuit 108 includes: data bit invalidating circuit 108*a* receiving test data TDI and output signal XUP of gate circuit 108*b* to generate test data bits TEDI0 to TEDIs. A configuration of data bit invalidating circuit 108*a* is the same as the configuration shown in FIG. 26.

Figure 31:
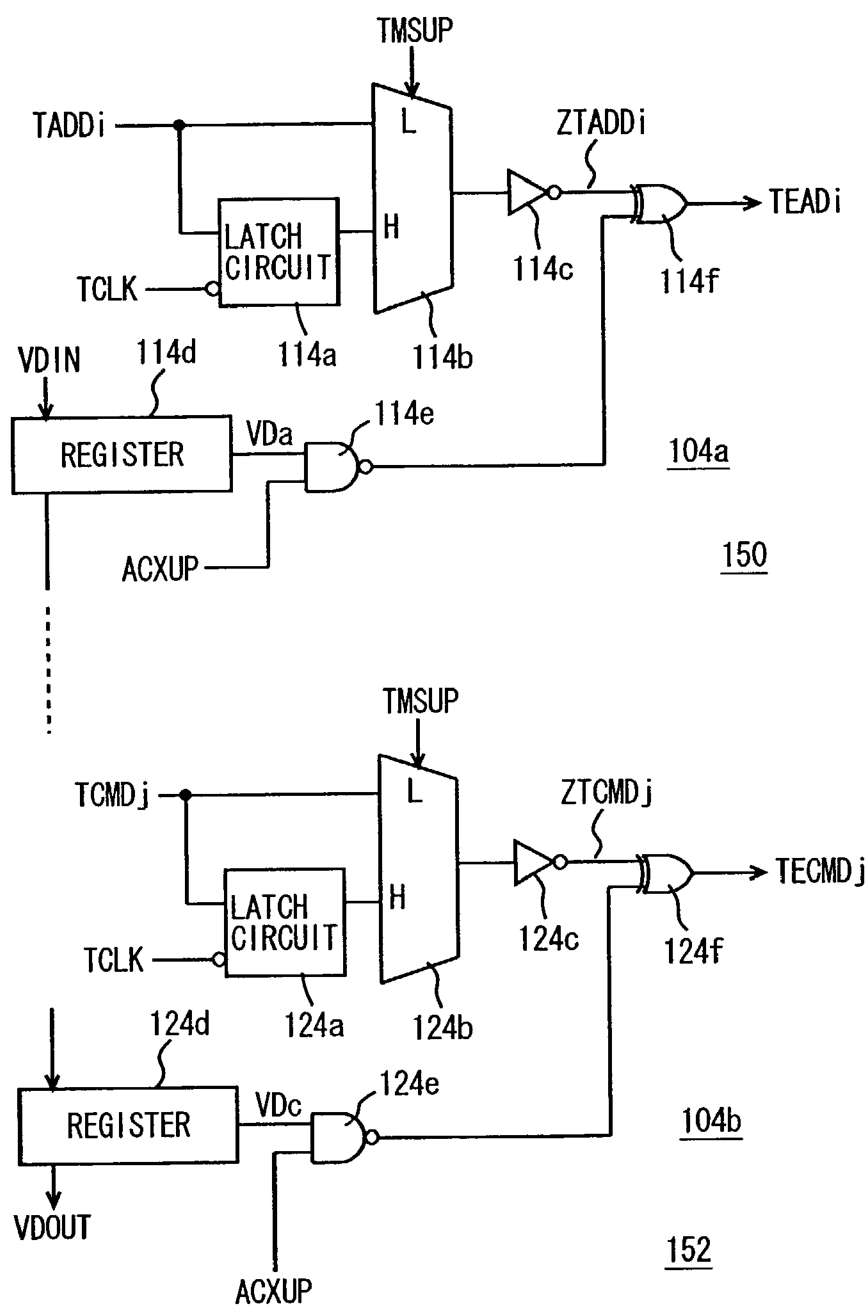
FIG. 31 is a diagram showing an example of configurations of an address bit invalidating circuit and a command signal invalidating circuit shown in FIG. 30.

FIG. 31 is a diagram schematically showing configurations of address bit invalidating circuit 104*a* and command signal invalidating circuit 104*b* shown in FIG. 30. In the circuit configuration shown in FIG. 31, invalidation control signal ACXUP is applied to NAND circuit 114*e* in place of asynchronous control signal PTX in address bit invalidating circuit 104*a*. An output signal of NAND circuit 114*e* is applied to EXOR circuit 114*f*.

Moreover, invalidation control signal ACXUP is applied to NAND circuit 124*e* in place of asynchronous control signal PTX in command signal invalidating circuit 104*b*. An output signal of NAND circuit 124*e* is applied to EXOR circuit 124*f*.

The other components of the configurations of address bit invalidating circuit 104*a* and command signal invalidating circuit 104*b* are the same as those of the configuration shown in FIG. 25, the same reference numerals are attached to corresponding components and detailed descriptions thereof are not repeated.

In the ninth embodiment as well, registers included in invalid signal generating circuits 104 and invalid data generating circuit 108 are preferably arranged so as to constitute a serial scan path for transferring data serially.

Figure 32:
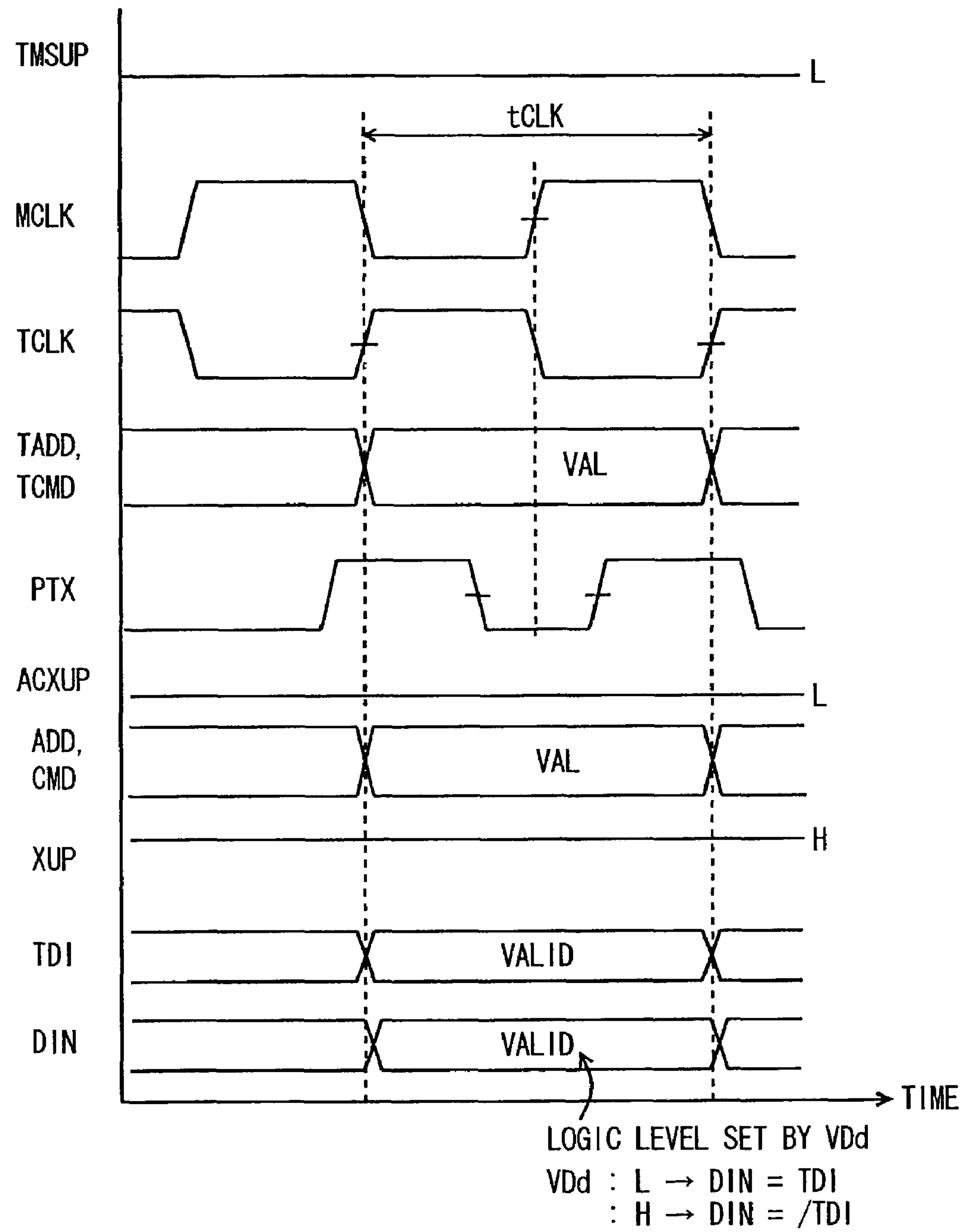
FIG. 32 is a timing chart representing an operation of a test interface circuit shown in FIG. 30.

FIG. 32 is a timing chart representing an operation of the circuits shown in FIGS. 30 and 31 in a case when test setup instructing signal TMSUP is set to L level. Description will now be given of operation of the circuits shown in FIGS. 30 and 31.

When test setup instructing signal TMSUP is set to L level, multiplexers 114*b* and 124*b* shown in FIG. 31 select test address signal TADD and test command TCMD transferred from a corresponding test circuit. In data bit invalidating circuit 108*a* as well, multiplexer 118*b* selects 1-bit test data TDI as shown in FIG. 26.

In a mode where test setup signal TMSUP is set to L level, memory clock signal MCLK and test clock signal TCLK are clock signals in opposite phases with each other. In this state, invalidation control signal ACXUP from mode switch circuit 160 and invalidation control signal XUP from gate circuit 108*a* are set to L level and H level, respectively.

In address bit invalidating circuit 104*a*, an output signal of NAND circuit 114*e* shown in FIG. 31 is fixed at H level and in command signal invalidating circuit 104*b* as well, an output signal of NAND circuit 124*e* is fixed at H level. Therefore, EXOR circuits 114*f* and 124*f* shown in FIG. 31 each operate as an inverter, and test address signal bits TEAD0 to TEADn and test command signals TCMD0 to TECMm attain the same logic level as that of a bit/signal applied from a corresponding test circuit, while address signal ADD and command CMD applied to the memory change in synchronization with a rise of test clock signal TCLK similarly to test address signal TADD and test command TCMD.

In data bit invalidating circuit 108*a*, invalidation control signal XUP is at H level, NAND circuit 118*e* shown in FIG. 26 operates as an inverter and a logic level of test data bit TEDIk is set according to data VDd stored in register 118*d*. Test data bit TEDIk attains the same logic level as that of test data TDI when data VDd stored in register 118*d* is at L level, and attains an inverted logic level of test data TDI when data VDd is set at H level.

Therefore, in this test mode, 256 bit test data having a desired pattern can be generated from 1-bit test data TDI according to stored data in register 118*d* in each data bit invalidating circuit 108*a* to be applied to memory 3.

When test setup instructing signal TMSUP is set to L level, test data with various patterns are applied as test data DIN to memory 3 to perform a functional test on memory 3.

Therefore, when test setup instructing signal TMSUP is at L level, a test address and a test command to memory 3 can be generated according to test address signal TADD and test command TCMD applied externally regardless of asynchronous control signal PTX, data stored in address bit invalidating circuit 104*a* and data stored in command signal invalidating circuit 104*b*, facilitating production of a test program.

FIG. 33 is a timing chart representing an operation of the circuits shown in FIGS. 30 and 31 in a case when test setup instructing signal TMSUP is set to H level. Description will now be given of operation in a case when test setup instructing signal TMSUP is set to H level with reference to FIG. 33.

When test setup instructing signal TMSUP is set to H level of 1.8 V, for example, multiplexers 114*b* and 124*b* select output signals of respective latch circuits 114*a* and 124*a*. That is, in a test mode where test setup instructing signal TMSUP is set to H level, since memory clock signal MCLK and test clock signal TCLK are clock signals in phase with each other, test address TADD, test command TCMD and test data DIN are delayed by a half clock cycle of test clock signal TCLK by latch circuits 114*a* and 124*a*.

When test setup instructing signal TMSUP is at H level, AND circuit 160*a* is shown in FIG. 30 operates as a buffer circuit and gate circuit 108*b* also operates as a buffer, and invalidation control signals XUP and ACXUP change according to asynchronous control signal PTX.

Asynchronous control signal PTX is set to H level prior to a fall of test clock signal TCLK. When test clock signal TCLK falls to L level, test address TADD and test command TCMD applied from latch circuits 114*a* and 124*a* through multiplexers 114*b* and 124*b* change, and output signals ZTADDi and ZTCMDj of inverters 114*c* and 124*c* attain logically inverted states (/VAL) of a test address signal and a test command signal.

Similarly, test data TDI is applied to EXOR circuit 118*f* shown in FIG. 26 through an inverter in synchronization with a fall of test clock signal TCK. As to this test data as well, logically inverted data /DATA is applied to EXOR circuit 118*f*.

When asynchronous control signal PTX is at H level, NAND circuits 114*a* and 124*e* operate as inverters since invalidation control signal ACXUP is also at H level. Therefore, when data VDa and VDc stored in registers 114*d* and 124*d* are both at H level, address signal ADD and command CMD at logically inverted levels, /VAL, of logical levels VAL of test address signal TADD and test command TCMD are transmitted to memory 3, since EXOR circuits 114*f* and 124*f* operate as buffer circuits when asynchronous control signal PTX is at H level.

When data VDa and VDc stored in registers 114*d* and 124*d* are both at L level, address signal ADD and command CMD applied to memory 3 change in synchronization with a fall of test clock signal TCLK since NAND circuits 114*e* and 124*e* output the signals at H level.

This operation also applies to test data TDI in a similar manner. When data VDd stored in register 118_d_ shown in FIG. 26 is at H level, test data TDI alters a logic level thereof according to transition of asynchronous control signal PTX. When data VDd is at L level, data at the same logic level as that of test data TDI is outputted in synchronization with a fall of test clock signal TCLK independently of asynchronous control signal PTX.

When asynchronous control signal PTX turns L level, if data VDa, VDc and Vd are set at H level, EXOR circuits 114_f_, 124_f_ and 118_f_ operate as inverters, and address signal ADD, command CMD and data DIN at the same logic level as those of test address TADD, test command TCMD and test data TDI, respectively, are transferred to memory 3.

By raising asynchronous control signal PTX to H level again, signal/bits set to H level in data VDa, VDc and VDd are inverted in logic level.

Therefore, when setup instructing signal TMSUP is set to H level, setup and hold times tIS and tIH of each of an address signal bit, a command signal and a data bit can be individually measured. Detection of a setup/hold failure is made by performing a functional test for reading stored data in memory 3 through the test output circuit shown in FIG. 24 to determine whether or not memory 3 normally operates.

Therefore, in this test mode, a setup/hold failure can be identified on a signal/bit basis.

It should be noted that in measurement of setup and hold times, data DIN applied to memory 3 is a data bit at the same logic level as that of 1-bit test data TDI when data DIN is in a valid state and a register included in data invalidating circuit 108_a_ is used for storing data indicating whether or not data DIN is an object for measuring setup and hold times.

In addition, test setup instructing signal TMSUP is used as a mode switch signal for setting validation/invalidation of asynchronous control signal PTX and further for switching transfer paths for test data, a test address signal and a test command in accordance with phase relationship of test clock signal TCLK and memory clock signal MCLK. However, different control signals may be used as a mode switch signal for setting validation/invalidation of asynchronous control signal PTX and as a clock switch control signal for switching the transfer paths for a test address signal, a test command and test data. The mode switch signal and the clock switch control signal may be generated from a command decoder usually provided in the test interface circuit.

As described above, according the ninth embodiment of the present invention, state setting data is stored serially in registers of an address bit invalidating circuit, a command signal invalidating circuit and a data bit invalidating circuit using one-bit input data, and a invalidating signal/invalid data can be generated for a desired address signal, a command signal and a data bit for a memory using one-bit data. In addition, the memory can be tested using various data patterns by an invalidation control signal, thereby allowing facilitation of a functional test of the memory.

Tenth Embodiment

FIG. 34 is a diagram schematically showing a configuration of a main portion of a semiconductor integrated circuit according to a tenth embodiment of the present invention. In FIG. 34, a phase comparison circuit 120 for comparing the phases of memory clock signal MCLK and asynchronous control signal PTX is provided between invalid data generating circuit 108 and invalidating signal generating circuit 104. Phase comparison circuit 120 is of the same configuration as the phase comparison circuit shown in FIG. 10, and selects and sequentially transfers one of an output data of invalid data generating circuit 108, memory clock signal MCLK and asynchronous control signal PTX in accordance with shift clock signal SFTDR and transfer clock signal CLKDR.

Registers for storing data VDd in invalid data generating circuit 108 constitute a shift register to sequentially transfer data from serial input SIN in accordance with transfer clock signal CLKDR. Registers storing data VDa and VDc included in invalidating signal generating circuit 104 also constitute a serial data transfer path and transfer an output data of phase comparison circuit 120 in accordance with transfer clock signal CLKDR.

A shift output data of invalidating signal generating circuit 104 is applied to multiplexer 122. Multiplexer 122 selects one of output data from test circuit 110 and shift-out data from invalidating signal generating circuit 104 for transference to test data output terminal TDO through signal switch circuit 4 shown in FIG. 24.

Therefore, by inserting phase comparison circuit 120 in series with a serial data transfer path formed by registers included in invalid data generating circuit 108 and invalidating signal generating circuit 104, precision in timing measurement on setup and hold times can be improved.

In the configuration shown in FIG. 34, data at serial input SIN is sequentially transferred through registers in invalid data generating circuit 108, and applied to phase comparison circuit 120 and then data is serially transferred through registers in invalidating signal generating circuit 104. However, the order in arrangement of registers in the serial data transfer path is not particularly limited to the shown order. Such a configuration may be employed, in which data at serial input SIN is applied to registers included in invalidating signal generating circuit 104 and then data is serially transferred to invalid data generating circuit 108 through phase comparison circuit 120. In this arrangement, shift-out data of invalid data generating circuit 108 is applied to a signal switch circuit through multiplexer 122.

Phase comparison circuit 120 may be inserted at any position, such as between registers in invalid data generating circuit 108 or between registers in invalidating signal generating circuit 104. Moreover, a position of phase comparison circuit 120 may be at the input stage of a data transfer path of serial input data SIN or at the output stage from which shift-out data is outputted to multiplexer 122.

Therefore, phase comparison circuit 120 can be inserted serially at any position in the serial data transfer path constituted of registers in invalid data generating circuit 108 and invalidating signal generating circuit 104, to constitute the serial data transfer path.

Modification

FIG. 35 is a diagram showing a configuration of a modification of the tenth embodiment of the present invention. In FIG. 35, two phase comparison circuits 132 and 136 are provided. Phase comparison circuit 132 detects the phase of invalidation control signal XUP relative to memory clock signal MCLK and data. Phase comparison circuit 136 detects the phase of invalidation control signal ACXUP relative to memory clock signal MCLK, an address signal and a command. The configurations of phase comparison circuits 132 and 136 are the same as that of shown in FIG. 10.

Phase comparison circuit 132 is coupled to serial input SIN through serial data transfer path 130. Phase comparison circuit 136 is coupled to serial shift output SO through serial data transfer path 138. Serial data transfer path 134 is coupled between phase comparison circuits 132 and 136.

Serial shift-out SO is coupled to multiplexer 122 shown in FIG. 34.

In the configuration shown in FIG. 35, memory clock signal MCLK and invalidation control signal XUP for data are compared in the phase with each other, and memory clock signal MCLK is compared in the phase with invalidation control signal ACXUP for an address and a command. Phase comparison operations of phase comparison circuits 132 and 136 are selectively activated according to shift clock signal SFTDR, but is ceased when phase comparison circuits 132 and 136 are set in a state of taking in the output shift-out data of serial data transfer paths 130 and 134 at their respective preceding stages.

In the configuration shown in FIG. 35, phase differences between each of invalidation control signals XUP and ACXUP and memory clock signal MCLK are detected, and a correct timing measurement can be achieved without an influence of gate delays of gate circuit 108*b* and AND circuit 160*a* shown in FIG. 30.

It should be noted that in the configuration shown in FIG. 35 as well, phase comparison circuits 132 and 136 may be arranged adjacent to each other or alternatively inserted at any positions in a data transfer route of a serial data transfer path. Serial data transfer path transferring data invalidating setting data has only to be constructed of phase comparison circuits 132 and 136 together with registers included in invalid data generating circuit 108 and invalidating signal generating circuit 104.

In addition, phase comparison operations of phase comparison circuits 120, 132 and 136 are the same as the phase comparison operation of phase comparison circuit 20 shown in FIG. 10.

Mode switch signal MODE applied to multiplexer 122 shown in FIG. 34 is merely required to be generated from a command decoder provided in the test interface circuit. Further, shift clock signal SFTDR as well can be generated under control of a command decoder using an address signal applied for performing 8/256 selection in test circuit 110.

Transfer clock signal CLKDR is generated based on test clock signal TCLK.

A configuration of the test interface circuit in which 1*a* data pattern is determined based on serial input data from serial input SIN and 1-bit test data is developed to 256 bit data may be used in a semiconductor integrated circuit device having the JTAG test circuit shown in FIG. 19.

As described above, according to the tenth embodiment of the present invention, a circuit for comparing in the phase a memory clock signal with an asynchronous control signal is provided in a path transferring serial data, thereby achieving improved precision in timing measurement of setup and hold times.

In the eighth to tenth embodiments, data setting validation/invalidation of an address signal, a command and data is transferred through one serial data transfer path. However, a validation/invalidation control data path for an address signal and a command, and a validation/invalidation control data transfer path for data may be separately provided.

For example, a configuration may be employed, in which as for an address signal and a command, data from a data input terminal is serially transferred as validation/invalidation control data, and as for data, data from serial input SIN provided in addition to a data terminal is serially transferred as validation/invalidation control data. Furthermore, a configuration may be employed in which control data for an address signal and a command are formed using registers constituting boundary scan registers. Setting of control data for an address signal and a command and setting of control data for data can be performed in parallel to each other, thereby achieving reduction in time for setting validation/invalidation control data in registers.

The configurations shown in the first to seventh embodiments may be applied to configurations of the test interface circuits shown in the eighth to tenth embodiments.

Other Embodiments

Memory 3 may be any memory device, provided that the semiconductor memory device is integrated on the same semiconductor substrate together with a logic and transfers data in synchronization with a clock signal. The memory 3 may thus be of any type of SRAM (static random access memory), DRAM (dynamic random access memory) and flash type EEPROM (electrically programmable/readable/erasable read-only memory).

Furthermore, in this semiconductor integrated circuit device, other circuits such as an analog circuit and another kind of semiconductor memory device may be arranged. That is, this semiconductor integrated circuit device may be a system LSI.

As described above, according to the present invention, in access to an embedded memory, a valid/invalid period of data can be set according to a control signal applied asynchronously with a clock signal used in operation of the embedded memory. Thus, setup/reset times for the embedded memory can be measured correctly using an external tester.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device with a logic and a semiconductor memory device integrated on a common semiconductor substrate, comprising:

a hold circuit taking in and holding a test signal applied externally; and an alteration circuit for selectively altering a logic level of said test signal held in said hold circuit, in accordance with a control signal applied externally and asynchronously with a clock signal and having a logic level toggled within a cycle of said clock signal, for transmitting a modified signal subject to alteration to said semiconductor memory device in accordance with said control signal and asynchronously with said clock signal.

2. The semiconductor integrated circuit device according to claim 1, wherein said semiconductor memory device takes in the test signal transmitted from said alteration circuit in synchronization with a clock signal, and said control signal is applied asynchronously to said clock signal.

3. The semiconductor integrated circuit device according to claim 1, wherein said alteration circuit receives said control signal and said test signal, inverts and outputs said test signal when said control signal is at a first logic level, and outputs the test signal with a logic level of said test signal maintained when said control signal at a second logic level.

4. The semiconductor integrated circuit device according to claim 1, wherein said semiconductor memory device is a synchronous semiconductor memory device taking in a received signal in synchronization with a clock signal, and said semiconductor integrated circuit device further comprises:

a phase calibration circuit for calibrating a phase difference between said control signal and said clock signal.

5. The semiconductor integrated circuit device according to claim 1, wherein said alteration circuit is provided corresponding to each of input nodes of said semiconductor memory device.

6. The semiconductor integrated circuit device according to claim 1, wherein said alteration circuit includes a circuit for setting said control signal to an invalid state.

7. The semiconductor integrated circuit device according to claim 1, wherein said alteration circuit is provided corresponding to each input node of said semiconductor memory device, and semiconductor integrated circuit device further comprises:

a scan circuit including a plurality of register circuits connected in series to each other, and said alteration circuit comprises:

a plurality of invalidating register circuits, provided corresponding to said plurality of register circuits of said scan circuit, for storing data signals from corresponding registers; and a plurality of gate circuits, provided corresponding to the respective invalidating register circuits, each for invalidating the control signal in response to an output signal of a corresponding invalidating register circuit.

8. The semiconductor integrated circuit device according to claim 1, further comprising:

a scan circuit including a plurality of register circuits, connected in series to each other, for sequentially transferring a signal applied externally in synchronization with a transfer signal, and said scan circuit includes a register circuit for taking in said control signal in synchronization with said transfer signal.

9. The semiconductor integrated circuit device according to claim 1, wherein said semiconductor memory device inputs and outputs signals including data in synchronization with a clock signal, and said alteration circuit further comprises a delay alteration circuit for modifying a delayed test signal, generated by delaying said test signal by a half cycle of said clock signal, in accordance with said control signal for transference to said semiconductor memory device.

10. A semiconductor integrated circuit device with a logic and a semiconductor memory device integrated on a common semiconductor substrate, comprising:

a scan circuit including a plurality of register circuits, for transferring serially a test control signal applied externally;

a selection circuit for selecting either of a data signal outputted from said semiconductor memory device and the test control signal to be transferred serially for transference to a register circuit of said scan circuit;

a test control register circuit for selectively storing an output signal of a specific register circuit of said scan circuit; and a transfer circuit for modifying a test signal applied externally in accordance with a stored signal in said test control register circuit and a control signal, applied externally and asynchronously with a clock signal, having a logic level toggled within a cycle of said clock signal for transmission to said semiconductor memory device, the test signal subject to modification having a logic level toggled within the cycle of said clock signal in accordance with said control signal.

11. The semiconductor integrated circuit device according to claim 10, further comprising:

a plurality of test control register circuits including said test control register circuit, provided corresponding to a specific register circuit of said circuit, for selectively storing an output signal of said specific register circuit, and a second selection for selectively transmitting the output signal of said specific register circuit to a corresponding one of the test control register circuits according to a select signal for storage, said plurality of test control register circuits being provided corresponding to different nodes of the input nodes of said semiconductor memory device.

12. The semiconductor integrated circuit device according to claim 11, further comprising a plurality of transfer circuits including said transfer circuit, provided corresponding to the respective test control register circuits, each for modifying the test signal applied externally according to said control signal and said stored signal in a corresponding test control register circuit for transference to a corresponding input node of said semiconductor memory device.

* * * * *